United States Patent
Merrill et al.

(10) Patent No.: US 6,960,757 B2
(45) Date of Patent: Nov. 1, 2005

(54) SIMPLIFIED WIRING SCHEMES FOR VERTICAL COLOR FILTER PIXEL SENSORS

(75) Inventors: Richard B. Merrill, Woodside, CA (US); Robert S. Hannebauer, Sunnyvale, CA (US); Glenn J. Keller, West Chester, PA (US); James Tornes, Menlo Park, CA (US)

(73) Assignee: Foveon, Inc., Santa Clara, CA (US)

( * ) Notice: Subject to any disclaimer, the term of this patent is extended or adjusted under 35 U.S.C. 154(b) by 320 days.

(21) Appl. No.: 10/418,881

(22) Filed: Apr. 16, 2003

(65) Prior Publication Data

US 2004/0185597 A1 Sep. 23, 2004

Related U.S. Application Data

(63) Continuation-in-part of application No. 09/884,863, filed on Jun. 18, 2001, now Pat. No. 6,727,521.

(51) Int. Cl.[7] .................................................. G01J 3/50
(52) U.S. Cl. ..................................... 250/226; 250/208.1
(58) Field of Search ............................. 250/226, 280.1, 250/214 R; 257/294, 440; 348/272, 273

(56) References Cited

U.S. PATENT DOCUMENTS

| 3,971,065 A | 7/1976 | Bayer ........................... 358/41 |
| 4,011,016 A | 3/1977 | Layne et al. ................. 356/195 |
| 4,238,760 A | 12/1980 | Carr ............................. 357/30 |
| 4,309,604 A | 1/1982 | Yoshikawa et al. ......... 250/226 |
| 4,318,115 A | 3/1982 | Yoshikawa et al. ........... 357/30 |
| 4,613,895 A | 9/1986 | Burkey et al. ................ 358/41 |
| 4,651,001 A | 3/1987 | Harada et al. ............... 250/330 |
| 4,677,289 A | 6/1987 | Nozaki et al. ............... 250/226 |
| 4,772,335 A | 9/1988 | Huang ......................... 136/258 |
| 5,397,734 A | 3/1995 | Iguchi et al. ................. 437/70 |
| 5,502,299 A | 3/1996 | Standley ................... 250/208.2 |
| 5,608,243 A | 3/1997 | Chi et al. ................... 257/249 |
| 5,668,596 A | 9/1997 | Vogel .......................... 348/222 |

(Continued)

FOREIGN PATENT DOCUMENTS

| DE | WO 98/19455 A1 | 5/1998 | ............ H04N/3/15 |
| EP | 0 707 417 A2 | 4/1996 | ............ H04N/3/15 |
| JP | 61-187282 | 8/1986 | ........... H01L/31/10 |
| JP | 01-134966 | 5/1989 | ........... H01L/27/14 |
| JP | 0 605 898 A | 7/1994 | ......... H01L/27/146 |

OTHER PUBLICATIONS

S. Chamberlain, "Photosensitivity and Scanning of Silicon Image Detector Arrays", *IEEE Journal of Solid–State Circuits*, vol. SC–4, No. 6, pp. 333–342, Dec. 1969.

B.C. Burkey et al., "The Pinned Photodiode For an Interline–Transfer CCD Image Sensor", *1984 IEDM Tech Digest*, p. 28–31, Dec. 1984.

(Continued)

*Primary Examiner*—Que T. Le
(74) *Attorney, Agent, or Firm*—Sierra Patent Group, Ltd.

(57) ABSTRACT

Vertical-color-filter pixel sensors having simplified wiring and reduced transistor counts are disclosed. In an embodiment, a single line is used for reference voltage, pixel reset voltage, and column-output signals in a VCF pixel sensor. In another embodiment, row-reset signals and row-enable signals are sent across a line that is shared between adjacent rows in an array of VCF pixel sensors. The present invention also provides an optimized layout for a VCF pixel sensor with shared row-reset, row-enable, reference voltage and column-output lines as well as a VCF pixel sensor in which source-follower voltage, source-follower amplifier voltage and row-enable signals all share a common line. These combined line embodiments can be used with a single column-output line as well as two row-enable lines. The embodiments can also be implemented in a VCF pixel sensor without a row-enable transistor.

19 Claims, 26 Drawing Sheets

U.S. PATENT DOCUMENTS

| | | | |
|---|---|---|---|
| 5,739,562 A | 4/1998 | Ackland et al. | 257/291 |
| 5,872,371 A | 2/1999 | Guidash et al. | 257/230 |
| 5,883,421 A | 3/1999 | Chouikha et al. | 257/461 |
| 5,889,315 A | 3/1999 | Farrenkopf et al. | 257/552 |
| 5,899,714 A | 5/1999 | Farrenkopf et al. | 438/202 |
| 5,949,061 A | 9/1999 | Guidash et al. | 250/208.1 |
| 5,965,875 A | 10/1999 | Merrill | 250/226 |
| 6,066,510 A | 5/2000 | Merrill | 438/57 |
| 6,078,037 A | 6/2000 | Booth, Jr. | 250/208.1 |
| 6,111,300 A | 8/2000 | Cao et al. | 257/440 |
| 6,410,899 B1 | 6/2002 | Merrill et al. | 250/208.1 |
| 6,727,521 B2 | 4/2004 | Merrill | 257/98 |
| 6,731,397 B1 | 5/2004 | Merrill et al. | 358/1.16 |
| 6,852,562 B1 * | 2/2005 | Hopper et al. | 438/57 |
| 2002/0058353 A1 | 5/2002 | Merrill | 438/57 |
| 2004/0185597 A1 | 9/2004 | Merrill et al. | 438/70 |

OTHER PUBLICATIONS

S. Chamberlain et al., "Technology Progress And Trends In Solid–State Silicon Image Sensors", *IEEE 1985 Custom Integrated Circuits Conference*, pp. 112–118, Rochester, New York, 1985, no month.

R. Wolffenbuttel et al., "A Novel Approach to Solid–state Colour Sensing", *Senors and Actuactors*, vol. 9, pp. 199–211, 1986, no month.

R. Wolffenbuttel et al., "Performance of an Integrated Silicon Colour Sensors with a Digital Output in Terms of Response to Colours in the Colour Triangle", *Sensor and Actuators*, vol. A21–A23, pp. 574–580, 1990, no month.

P. Seitz et al., "Smart optical and image sensors fabricated with industrial CMOS/CCD semiconductor processes", *SPIE*, vol. 1900, pp. 21–30, Jul. 1993.

P. B. Denyer et al., "CMOS Image Sensors For Multimedia Applications", *IEEE 1993 Custom Integrated Circuits Conference*, pp. 11.5.1 to 11.5.4, 1993.

J. Kramer, "Photo–ASICs: Integrated Optical Metrology Systems with Industrial CMOS Technology", *Doctorial Dissertation: Diss Eth Nr. 10186*. MSc Imperial College of Science and Technology, pp. 44–47, 1993.

M. Chouikha, "Color sensitive photodetectors in standard CMOS and BiCMOS technologies", *SPIE*, vol. 2950, pp. 108–120, Aug. 1996.

H. Wong, "Technology and Device Scaling Considerations for CMOS Imagers", *IEEE Transactions on Electron Devices*, vol. 43, No. 12, Dec. 1996.

K. Parulski et al, "Enabling technologies for a family of digital cameras", *SPIE*, vol. 2654, pp. 156–163, 1996, no month.

B. Weibel, "High–end digital cameras can make professional indoor photography a snap", *Buyers Guide*, pp. 311–317, Apr. 1997.

D. Sutherland, "Neaveau Niche–Part 1: The Latest in digital SLRs", *Shutterbug*, pp. 200–209, Nov. 1997.

M. Chouikha, "Buried Triple p–n Junction Structure in a BiCMOS Technology for Color Detection", *IEEE BCTM 6.4*, pp. 108–111, Sep. 1997.

A. Theuwissen, "Fundamentals of Solid–State Imaging", *Solid–State Imaging with Charge–coupled Devices*, pp. 131–141, 1995 Reprinted with corrections 1996,1997.

R. Guidash, "A 0.6 um CMOS Pinned Photodiode Color Imager Technology", *IEDM*, pp. 927–929, 1997, no month.

D. Knipp et al, "Low Cost Approach to Realize Novel Detectors for Color Recognition", *Proc. ICPS 98* (International Congress on Imaging Science), pp. 350–353, Sep. 1998.

H. Miura et al, "A 100 Frame/s CMOS Active Pixel Sensor for 3D–Gesture Recognition System" 1999 IEEE International Solid–State Circuits Conference, pp. 142–143, Jun. 1999.

Stiebig et al., Transient Behavior of Optimized nipiin Three–Color Detectors, *IEEE Transactions on Electron Devices*, vol. 45, No. 7, pp. 1438–1443, Jul. 1998.

* cited by examiner

SIMPLIFIED WIRING SCHEMES FOR VERTICAL COLOR FILTER PIXEL SENSORS

RELATED APPLICATIONS

This application is a continuation-in-part of U.S. patent application Ser. No. 09/884,863, entitled VERTICAL-COLOR-FILTER PIXEL SENSOR AND ARRAY, filed Jun. 18, 2001 now U.S. Pat. No. 6,727,521.

FIELD OF THE INVENTION

The present invention relates to pixel sensors. More particularly, the present invention relates to full-color pixel sensors and arrays that use semiconductor material to chromatically filter light vertically and sense multiple wavelength bands at the same location.

BACKGROUND OF THE INVENTION

In active pixel sensors a traditional approach has been to supply a voltage reference for the reset operation of the photodiode within each pixel sensor along one set of wires running through an array of pixel sensors and to read the pixel photocurrent value out on another set of wires running through the array. Wiring for a pixel sensor directly affects the fill factor and the number of components required, thus limiting the performance of the array and affecting the cost to manufacture pixel sensor arrays. For pixel sensors having increased complexity, such as vertical-color-filter (VCF) pixel sensors, wiring schemes are particularly important and need to be optimized as much as possible.

SUMMARY OF THE INVENTION

In one aspect, the present invention provides a passive vertical-color-filter pixel formed on a semiconductor substrate and comprising at least two detector layers configured to collect photo-generated carriers of a first polarity, separated by additional intervening layers configured to collect and conduct away photo-generated carriers of the opposite polarity, the at least two layers disposed substantially in vertical alignment with each other and having different spectral sensitivities as a function of their different depths in the semiconductor substrate, the pixel having a plurality of photodiodes, a plurality of color enable gates and a column output line.

In another aspect, the present invention provides an active vertical-color-filter pixel formed on a semiconductor substrate and comprising at least two detector layers configured to collect photo-generated carriers of a first polarity, separated by additional intervening layers configured to collect and conduct away photo-generated carriers of the opposite polarity, the at least two layers disposed substantially in vertical alignment with each other and having different spectral sensitivities as a function of their different depths in the semiconductor substrate, the pixel having a plurality of photodiodes, the pixel having a pixel reset voltage and column-output sharing a common line.

In yet another aspect, the present invention provides an active vertical-color-filter pixel formed on a semiconductor substrate and comprising at least two detector layers configured to collect photo-generated carriers of a first polarity, separated by additional intervening layers configured to collect and conduct away photo-generated carriers of the opposite polarity, the at least two layers disposed substantially in vertical alignment with each other and having different spectral sensitivities as a function of their different depths in the semiconductor substrate, the pixel having a plurality of photodiodes, the pixel having a shared source-follower voltage and reset voltage.

In yet another aspect, the present invention provides an active vertical-color-filter pixel formed on a semiconductor substrate and comprising at least two detector layers configured to collect photo-generated carriers of a first polarity, separated by additional intervening layers configured to collect and conduct away photo-generated carriers of the opposite polarity, the at least two layers disposed substantially in vertical alignment with each other and having different spectral sensitivities as a function of their different depths in the semiconductor substrate, the pixel having a plurality of photodiodes, the pixel having a common line for reset voltage signals, source-follower voltage, and row-enable signals.

In yet another aspect, the present invention provides an array of active vertical-color-filter pixels, each pixel formed on a semiconductor substrate and comprising at least two detector layers configured to collect photo-generated carriers of a first polarity, separated by additional intervening layers configured to collect and conduct away photo-generated carriers of the opposite polarity, the at least two layers disposed substantially in vertical alignment with each other and having different spectral sensitivities as a function of their different depths in the semiconductor substrate, the pixel having a plurality of photodiodes, the pixel having at least one read transistor for reading the pixel and a common line for row reset signals and row-enable signals, wherein array is arranged in rows and columns of pixels, the array configured such that the read transistors from one row are cross connected with the photodiodes of another row while the common line shares reset signals for one row in the array and row-enable signals for an adjacent row in the array.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons having the benefit of this disclosure.

Figure 1:
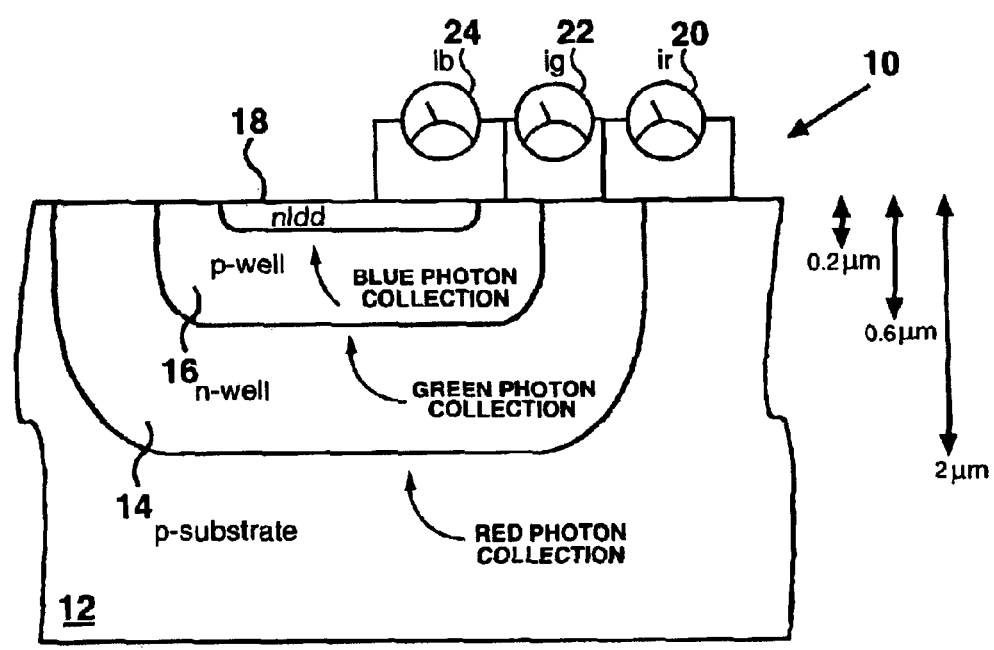
FIG. 1 is a cross-sectional view of a prior-art three-color VCF pixel sensor.

FIG. 1 illustrates a first illustrative and non-limiting example of a VCF pixel sensor that can be used to practice the present invention. The cross-sectional view shows a prior-art VCF pixel sensor 10 of the type disclosed in U.S. Pat. No. 5,965,875 to Merrill. FIG. 1 shows a VCF pixel sensor fabricated in a triple-well process wherein the blue, green, and red sensors are disposed at different depths beneath the surface of the semiconductor substrate 12 upon which the imager is fabricated. As may be seen from an examination of FIG. 1, the red photodiode is comprised of the junction between the p-type substrate 12 and the n-type well 14, the green photodiode is comprised of the junction between the n-type well 14 and the p-type well 16, and the blue photodiode is comprised of the junction between the p-type well 16 and the n-type lightly-doped-drain implant 18 at the surface of the substrate. Photocurrent is sensed from the red, green, and blue photodiodes as indicated symbolically by current meters 20, 22, and 24, respectively. The photodiodes in the VCF pixel sensor of FIG. 1 are connected directly to one another in series and are thus of alternating polarity.

Figure 2A:
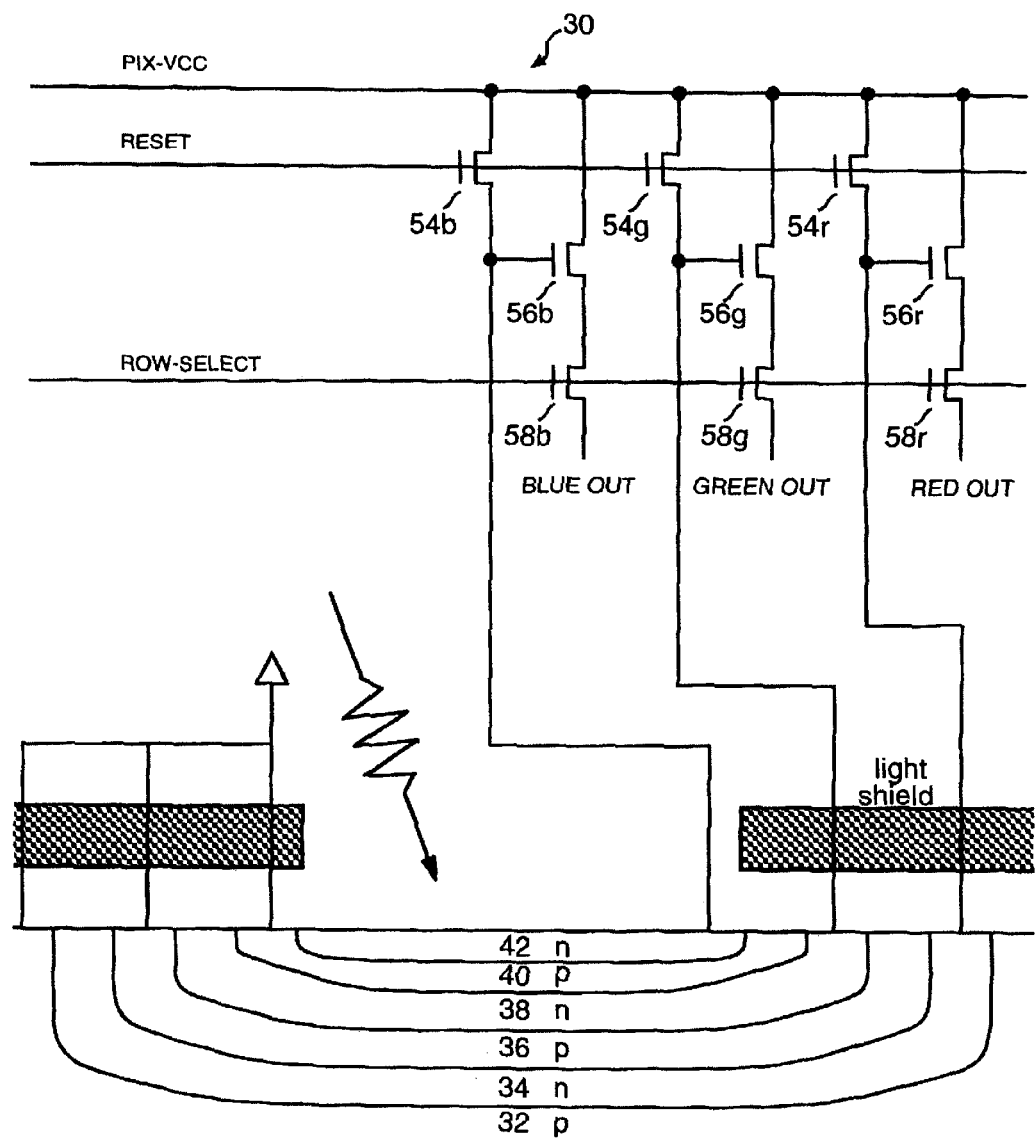
FIG. 2A is a combination semiconductor cross sectional diagram and schematic diagram of a VCF pixel sensor according to the present invention.

FIG. 2A illustrates a second illustrative and non-limiting example of a VCF pixel sensor that may be used to practice the present invention. VCF pixel sensor 30 is a six-layer structure that is shown schematically in cross-sectional view fabricated on p-type semiconductor substrate 32. This type of VCF pixel sensor has three n-type regions, isolated vertically by p-regions that are all connected to the substrate potential.

Figure 2B:
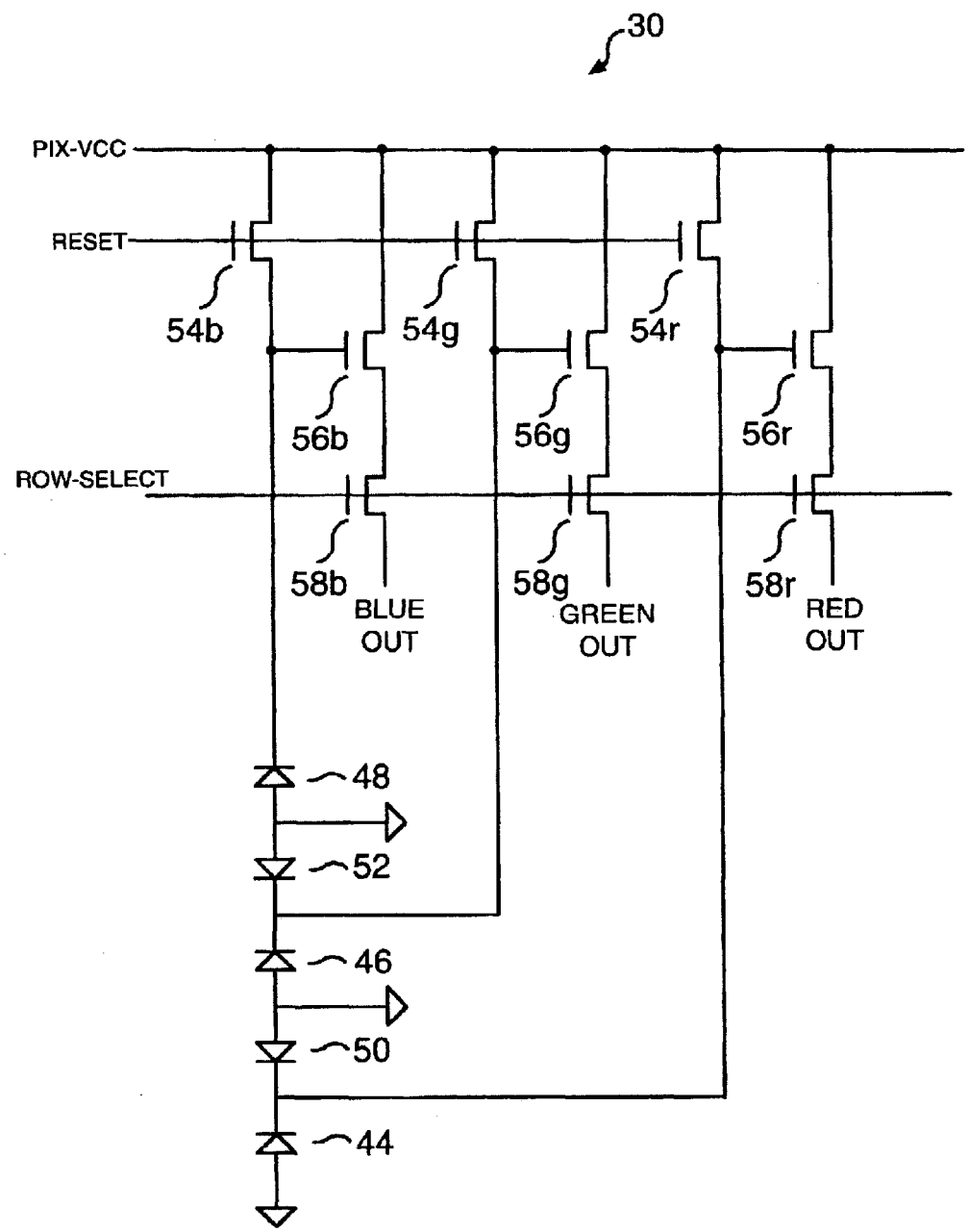
FIG. 2B is a schematic diagram depicting the same VCF pixel sensor as shown in FIG. 2A in which the photodiodes are represented schematically as semiconductor diode symbols.

The blue, green, and red photodiode sensors are formed by the junctions between the n-type and p-type regions, and are disposed at different depths beneath the surface of the semiconductor structure. In comparison to the structure of FIG. 1., the addition of the extra layers results in a structure in which the red, green, and blue photocurrent signals are all taken from the n-type cathodes of three isolated photodiodes. This is shown schematically in FIG. 2B, which depicts the same VCF pixel sensor as shown in FIG. 2A. In FIG. 2B the photodiodes are represented schematically as semiconductor diode symbols.

Both FIGS. 2A and 2B show a non-storage version of a VCF pixel sensor in which each of the red, green, and blue photodiodes is coupled to a transistor circuit. Each circuit has a reset transistor 54 driven from a RESET signal line and coupled between the photodiode cathode and a reset potential, a source-follower amplifier transistor 56 coupled to the photodiode cathode, and a row-select transistor 58 driven from a ROW-SELECT signal line and coupled between the source of the source-follower amplifier transistor and a row line. The suffixes "r," "g," and "b" are used to denote the color associated with each transistor. As is known in the art, the RESET signal is active to reset the pixel sensor and is then inactive during exposure, after which the row-select line is activated to read out the pixel data.

Figure 2C:
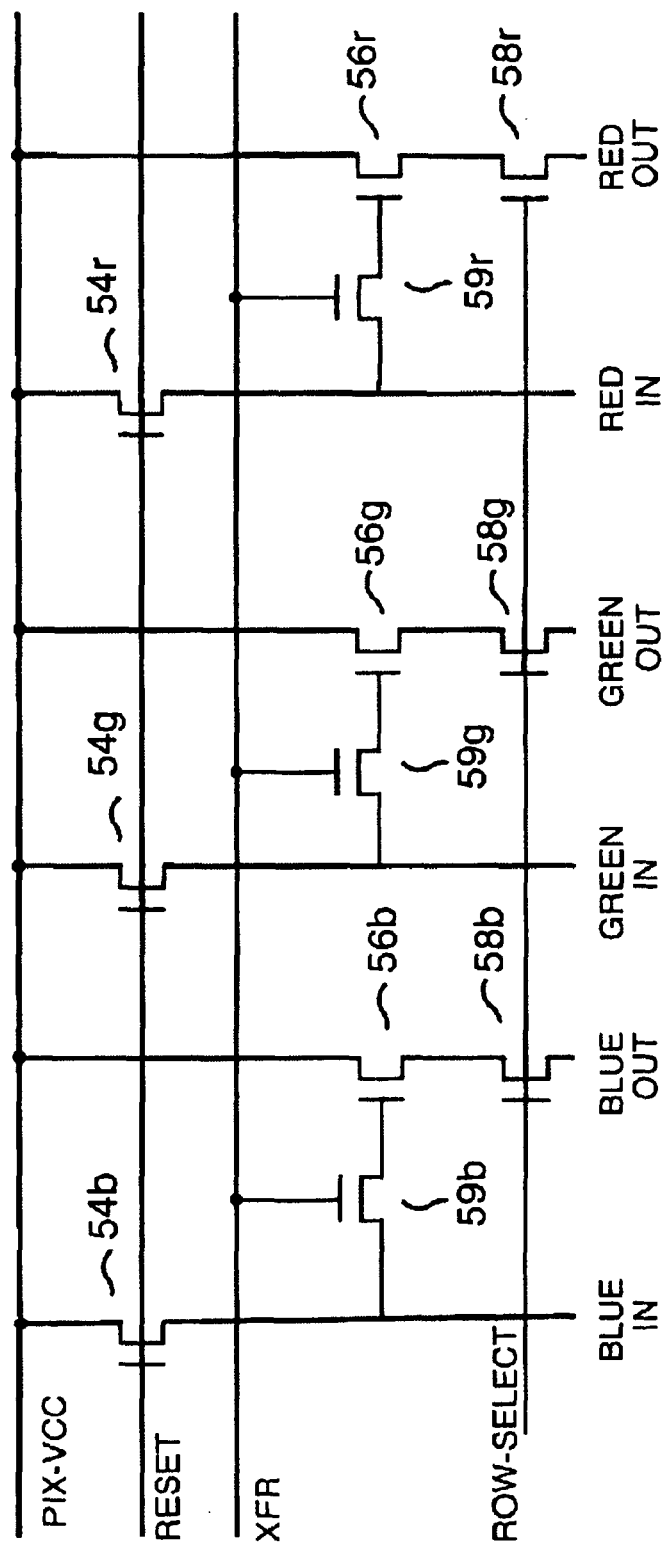
FIG. 2C is a schematic diagram depicting transistor circuitry that may be used in a storage version of the VCF pixel sensor of the present invention to which each of the red, green, and blue photodiodes is coupled.

Referring now to FIG. 2C, a schematic diagram depicts transistor circuitry that may be used in a storage version of the VCF pixel sensor of the present invention to which each of the red, green, and blue photodiodes is coupled. As is appreciated by persons of ordinary skill in the art, the transistor circuit of FIG. 2C includes an additional transfer transistor 59 not found in the circuits of FIGS. 2A and 2B. The gate of transfer transistor 59 is coupled to a XFR line that is held active for at least part of the time that the RESET voltage line is active and goes inactive at the end of the exposure time, after which the row-select line is activated to read out the pixel data. One advantage of the circuit of FIG. 2C is that the use of the transfer transistors eliminates the need for a mechanical shutter.

Figure 3:
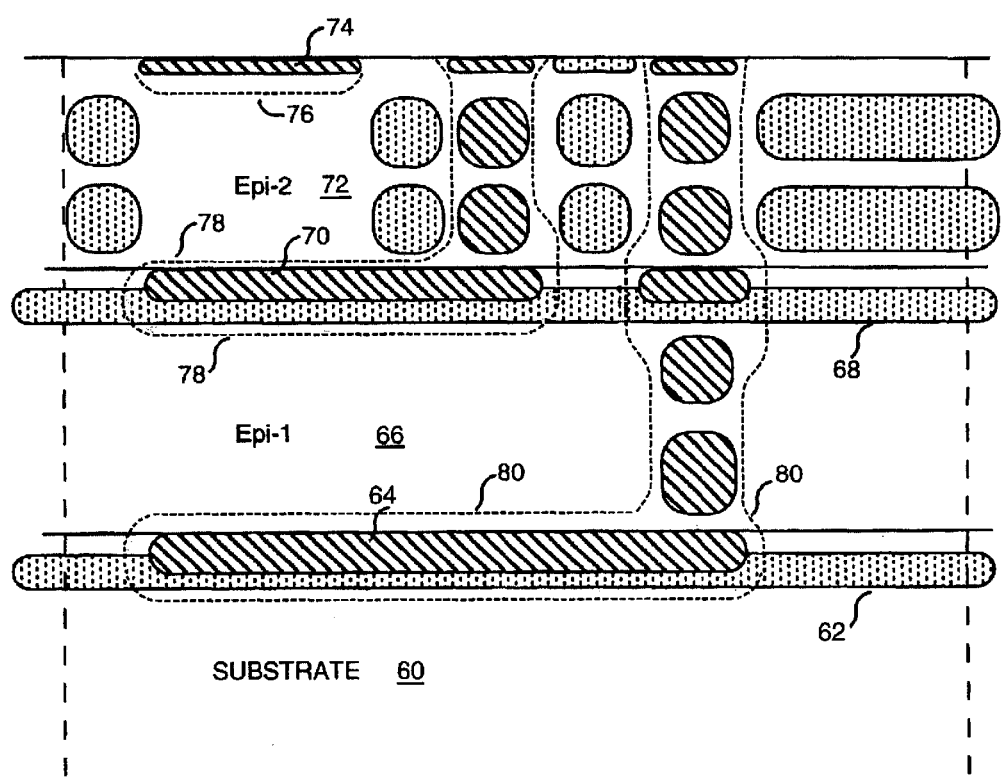
FIG. 3 is a semiconductor cross sectional diagram illustrating a vertical-color-filter pixel sensor employing epitaxial semiconductor technology.

From the disclosure herein, persons of ordinary skill in the art will recognize that there are numerous ways to realize VCF pixel sensors in a semiconductor structure. For example, the six-layer structure of alternating p-type and n-type regions can be formed using a semiconductor substrate as the bottom layer and forming five concentric wells of alternating conductivity type in the substrate. The hatched areas of FIG. 3 show the approximate locations of the implants used to create the p-type and n-type regions of the structure. The dashed line 76 defines the approximate border between the net-P and net-N doping for the blue detector 74. Similarly, the dashed line 78 defines the approximate border between the net-P and net-N doping for the green detector 70 with its vertical portion to the surface of the second epitaxial layer 72 forming the contact to the green detector 70. The dashed line 80 defines the approximate border between the net-P and net-N doping for the red detector 64 with its vertical portion to the surface of the second epitaxial layer 72 forming the contact to the red detector 64.

As may be seen from the above-recited illustrative examples, other embodiments of the six-layer structure disclosed herein are contemplated to be within the scope of the present invention and may be realized by using various combinations of layers selected from among the substrate, one or more wells disposed in the substrate, one or more epitaxial layers, and one or more wells disposed in one or more epitaxial layers.

Persons of ordinary skill in the art will observe that all of the red, green, and blue photodiodes (indicated at reference numerals 64, 70, and 74, respectively, in FIG. 3) can be operated so that the depletion regions of the photodiodes do not interact (i.e. they are junction isolated) but may be alternatively operated either through control of doping levels, structure spacing or operating voltages such that the depletion regions do interact and may also be deeply depleted.

An illustrative semiconductor fabrication process for fabricating the VCF pixel sensor of FIG. 3 is disclosed with reference to FIGS. 4A through 4E, cross-sectional diagrams showing the structure resulting after completion of selected steps in the process.

Figure 4A:
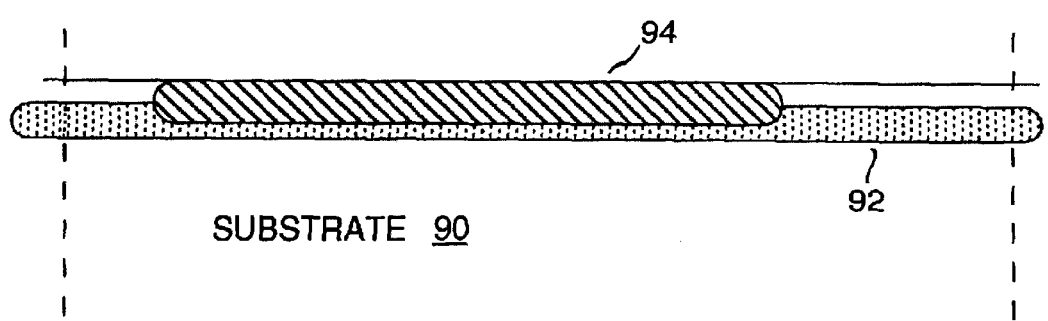
FIGS. 4A through 4E are cross sectional diagrams showing the structure resulting after completion of selected steps in the fabrication process.

The process starts with a 1e15 p-type substrate 90 shown in FIG. 4A. A blanket boron implant (shown at reference numeral 92) is performed to a depth of about 0.5 um. This boron implant 92 must be more heavily doped than the substrate because it acts as weak diffusion barrier to prevent electrons generated in the substrate 90 from diffusing up to the green photodiode, as well as separating the red photodiodes. This blanket implant may also serve to counteract autodoping during the subsequent epitaxial layer deposition step. This blanket implant should generally be anywhere from about 3× to 100× of the substrate doping level and in one embodiment of the invention is about 1e16. Next, an implant masking layer (not shown) is then applied using conventional photolithographic techniques. Next, as shown in FIG. 4A, a masked phosphorus 1e17 implant (shown at reference numeral 94) is performed at an energy of around 50 keV followed by an activation cycle as is known in the art to form the n-type layer for the red detector. This implant dose should be selected to be sufficient to overcompensate the blanket p-type implant. Persons of ordinary skill in the art will appreciate that the drive cycle must ensure adequate annealing for both the boron and phosphorus implants prior to growth of an epitaxial silicon layer. Persons skilled in the art will also recognize that the order of the p-type blanket implant and the n-type masked implant to form the red photodiode n-type region could be reversed.

Figure 4B:
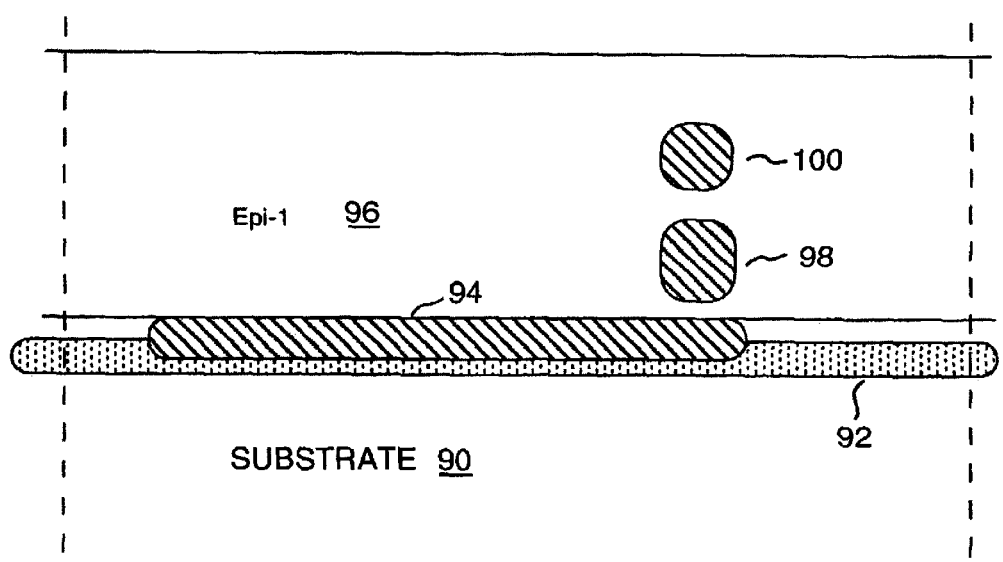

Referring now to FIG. 4B, next, a layer of 1e15 p-type epitaxial silicon 96 is grown to a thickness of about 2.0 um. The dopant concentration in the epitaxial layer 96 is as lightly doped as will guarantee p-type material in order that it will function as a potential well region so that photo-electrons generated therein do not diffuse past the p-type layers above or below it. Punch-through from red to green photodiodes is another design constraint affecting doping level in this layer, i.e., the doping needs to be sufficient to prevent depletion regions from the red and green photodiode cathodes from getting too close to each other, or fully depleting the p-type region between them.

Next, a plug implant masking layer (not shown) is then applied using conventional photolithographic techniques. A 1e17 phosphorus plug implant and an anneal sequence is then performed to form a plug contact to the cathode of the red photodiode. This plug implant should be a high-energy implant (i.e., about 1,000 KeV) or should comprise multiple implant steps at different energies. In one embodiment of the present invention, a tall, thin plug contact plug is formed by a combination of two different implants, one a high-energy implant 98 (i.e., about 1,200 KeV) for deep doping the bottom region of the plug contact, and the other a lower energy implant 100 (i.e., about 600 KeV) for doping the intermediate region of the plug contact, followed by a third implant or diffusion that is performed along with the doping for the green photodiode to complete the shallow surface region of the plug contact.

The plug resistance is not important since the photocurrent is small, however the size of the plug should be as small as possible to minimize pixel area and maximize fill factor. A plug size of 1 micron is a good target, but the depth of the plug contact needs to be about 2 microns. The multiple-implant plug disclosed herein makes it possible to achieve such a plug with a depth greater than its width.

Figure 4C:
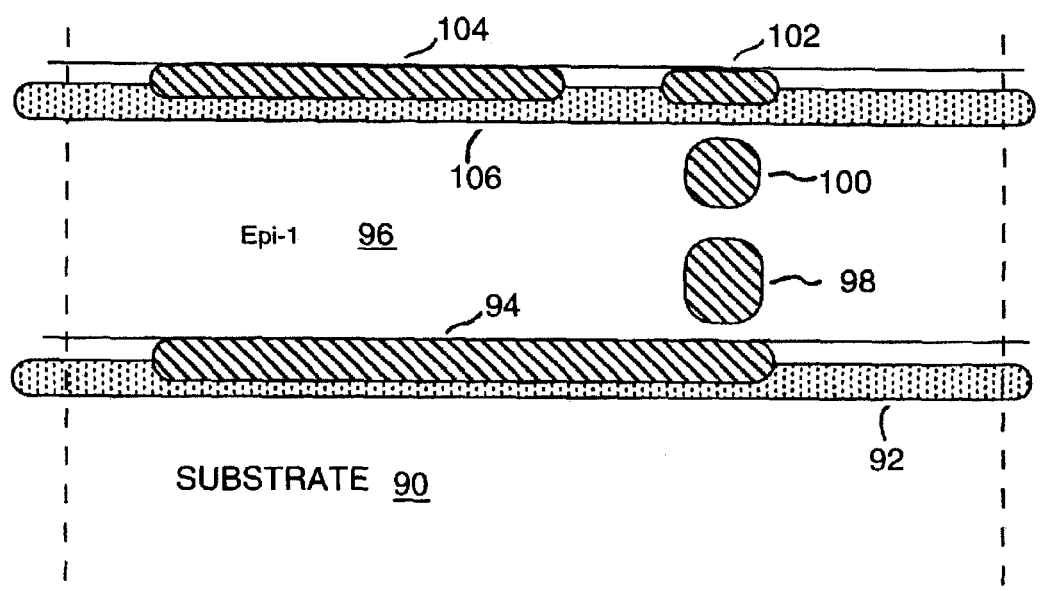

Referring now to FIG. 4C, an implant-masking layer (not shown) is then applied using conventional photolithographic techniques. A 1e17 phosphorus implant at an energy of around 50 KeV (shown at reference numeral 104) and activation sequence is then performed to form the n-type layer for the green detector. A second, smaller aperture in this masking layer serves to form the surface region 102 of the plug contact implant for the contact to the underlying cathode of the red detector. As persons of ordinary skill in the art will appreciate, this implant requires activation drive to restore lattice integrity before the subsequent epitaxial layer deposition step.

Next, a blanket boron implant 106 of the epitaxial layer 96 is performed. This implant serves to counteract autodoping during the subsequent epitaxial layer deposition step. This implant also serves as a weak diffusion barrier to prevent green-photon-generated carriers from diffusing upward to the blue detector and separates the green photodiodes. This blanket implant 106 should generally be anywhere from about 3× to 100× of the doping level of the first epitaxial layer 96 and in one embodiment of the invention is about 1e16. Persons skilled in the art will also recognize that the order of the p-type blanket implant and the n-type masked implant to form the green photodiode n-type region could be reversed, and that the doping concentration considerations are similar to those described above for the red photodiode.

Figure 4D:
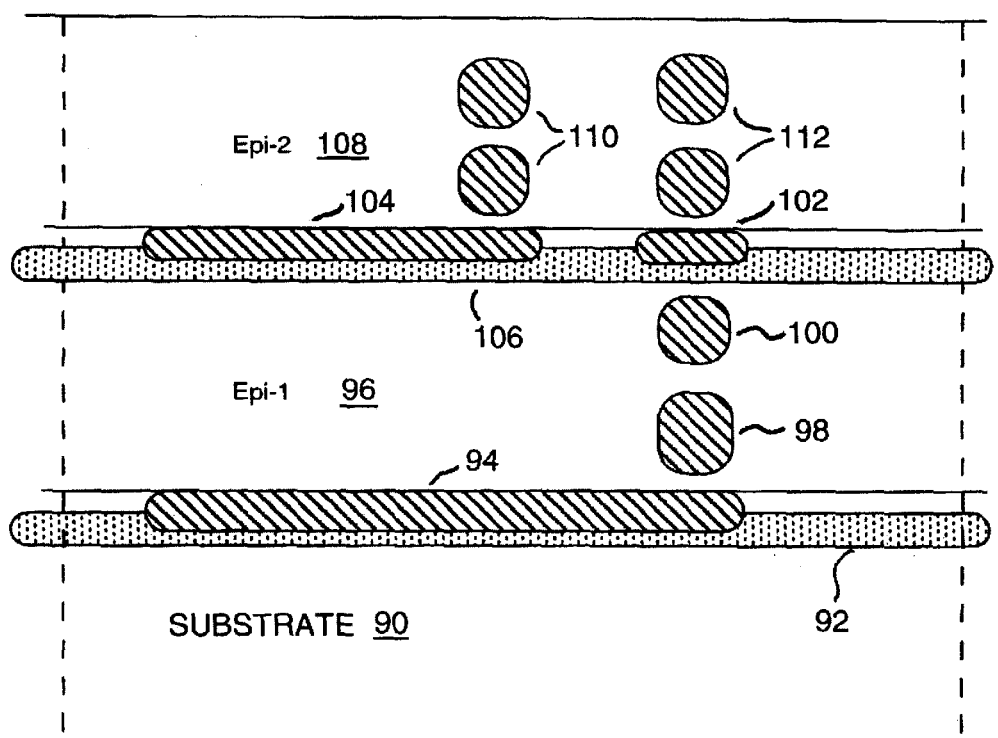

Referring now to FIG. 4D, a layer of 1e15 p-type epitaxial silicon 108 is grown to a thickness of about 0.7 to 1.0 um. An implant masking layer (not shown) is then applied using conventional photolithographic techniques. A standard CMOS n-well implant is performed to form n-well regions 110 to make contact to the cathode 104 of the underlying green detector and n-well region 112 to make contact to the top of the plug contact 102 for the cathode 94 of the bottom red detector. The n-well regions 110 and 112 may require a double implant to reach the buried layers comprising the cathode 106 of the green detector and the plug contact for the cathode 94 of the red detector; typical CMOS n-well implant energies are around 500 KeV and 100 KeV, respectively, for the deep and shallow implants in n-well regions 110 and 112.

Figure 4E:
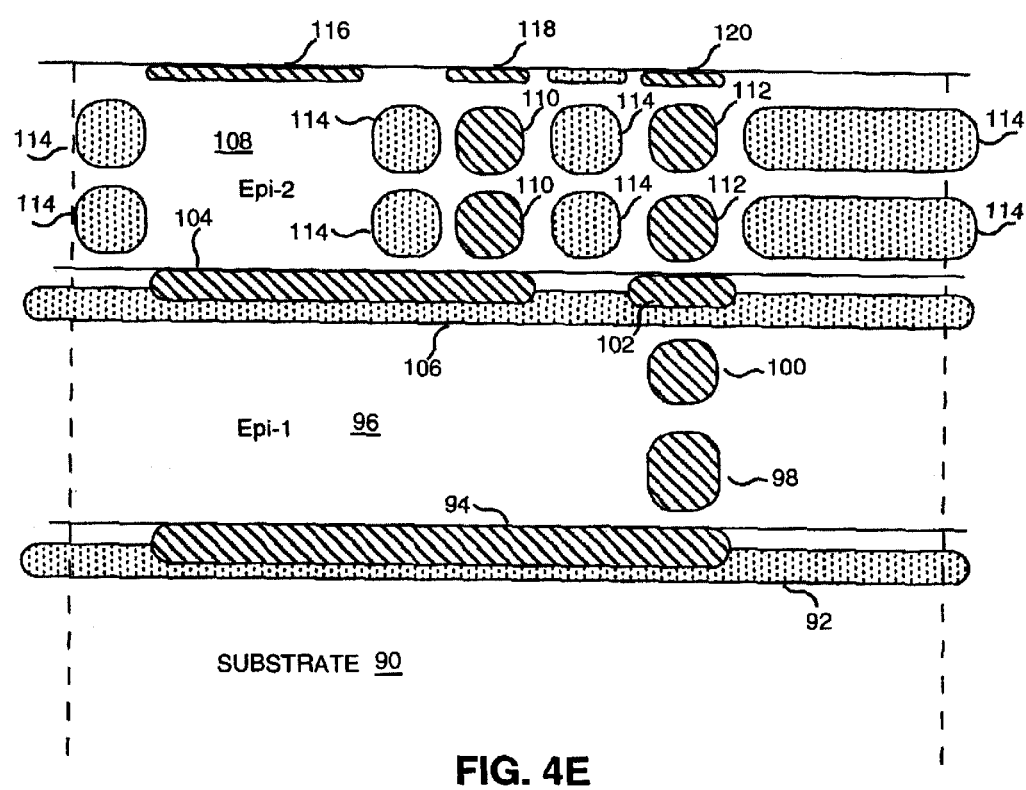

Referring now to FIG. 4E, an implant masking layer (not shown) is then applied using conventional photolithographic techniques. A CMOS p-well implant step is then performed to create p-well regions 114. As is understood by persons of ordinary skill in the art, the CMOS p-well implant step may require a double energy implant to minimize the n-well-to-n-well spacing. These p-well regions 114 are for isolation between the contacts for the red and green detector plugs as well as between pixels (the rightmost and leftmost edge p-well regions). In addition, this p-well implant is used to create wells in which NMOS transistors for the rest of the circuitry on the chip is formed.

Next, an implant masking layer (not shown) is then applied using conventional photolithographic techniques. A lightly-doped-drain implant shown at reference numeral 116 is then performed to form the cathode of the blue detector. In one embodiment of the invention, other apertures in this masking layer form surface portions of the deep contact regions for the red and green detectors, to allow good electrical contact to an overlying metal interconnect layer. Alternately, more heavily doped n-type regions may be formed in a separate processing step to form surface portions 118 and 120 of the deep contact regions for the red and green detectors as well as a contact region within the lightly-doped-drain implant for the blue detector. As an optional alternative to the illustrative process depicted in FIG. 4E, the cathode of the blue detector might be formed with a p-well underneath (i.e., an extension of regions 114).

The process employed for fabricating the VCF pixel sensor of the present invention is compatible with standard CMOS processes. The additional process steps are all performed prior to the standard CMOS steps, thus minimizing interactions.

Two epitaxial layers 96 and 108, as sometimes employed in BiCMOS, are required, as well as two extra implant activation cycles, one before each epitaxial growth step. As is apparent to such persons of ordinary skill, three extra masks are required in the process for implanting the n-type regions 94, 98, 100 102, and 104 for the red detector, the red contact plug, and the green detector. The process requires five extra implants including the red detector counterdoping 92 and the green detector counterdoping 106 (six extra implants are required if regions 98 and 100 are formed separately). The masking, implanting, drive in and anneal, and epitaxial growth fabrication process steps described above for fabricating the novel structure disclosed herein are individually well known to persons of ordinary skill in the semiconductor processing art for fabricating other semiconductor devices. Process parameters, such as times, temperatures, reactant species, etc. will vary between individual processes but are known for use in such individual processes. Such details will not be recited herein to avoid overcomplicating the disclosure and thus obscuring the invention.

The fabrication process disclosed herein provides several advantages. There are no large lateral diffusions associated with implant and drive wells, resulting in a smaller pixel area. The vertical plugs that are needed in order to connect to buried layers can be small.

There is no need for large n-type or p-type isolation rings. Only the detector plug contacts need to be isolated from each other and the other detectors. This allows for a small sensor group area.

As shown, this six-layer three-color photodiode structure uses two epitaxial layers, as are sometimes found in BiCMOS processes. Silicon quality generally improves as more epitaxial layers are grown. In addition, the sensor group including pixel readout circuits according to this embodiment of the present invention can be made in any BiCMOS fabrication facility. The topmost layers may be formed using a conventional CMOS process, (i.e., n+, n-well, and p-well). In addition, the layer referred to herein as the substrate may itself be an epitaxial layer formed on an underlying substrate.

Figure 5:
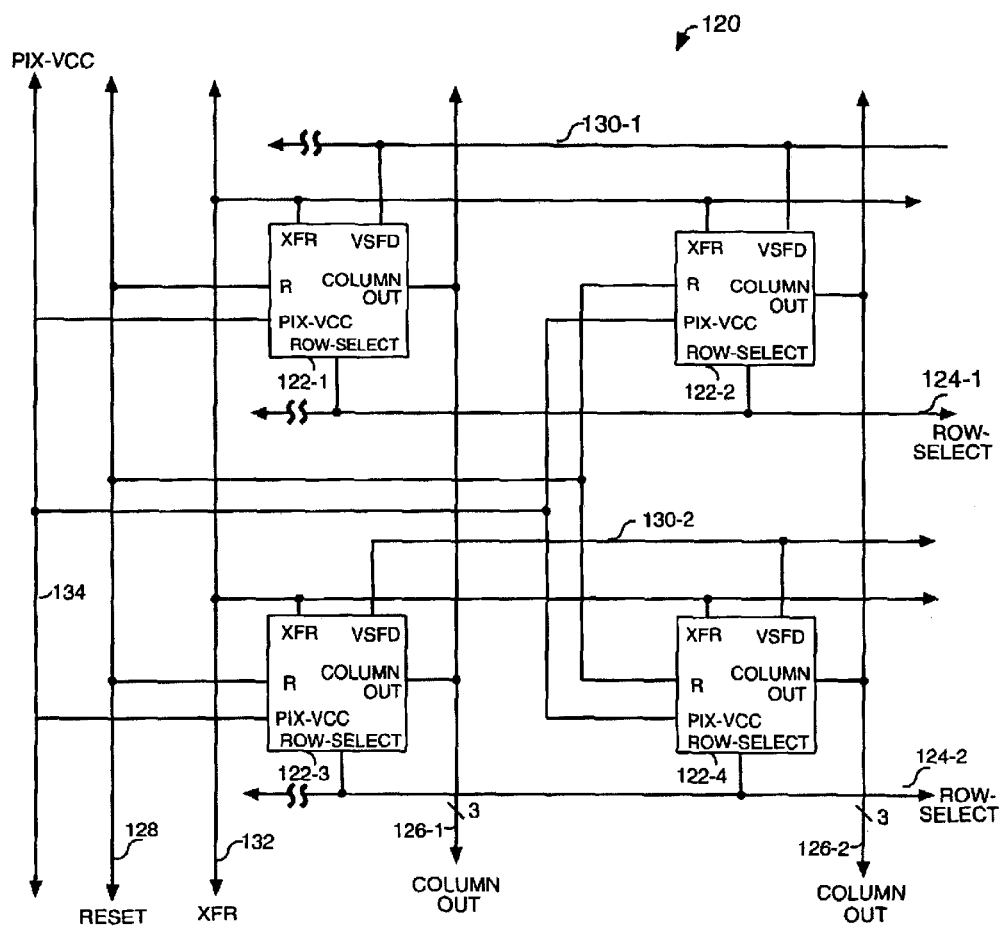
FIG. 5 is a diagram of an imaging array according to the present invention.

Referring now to FIG. 5, a diagram shows an illustrative 2 by 2 portion 120 of an array of VCF pixel sensors that may be used in accordance to the present invention. Persons of ordinary skill in the art will readily appreciate that the array portion disclosed in FIG. 5 is illustrative only and that arrays of arbitrary size may be fabricated using the teachings herein. The illustrative array example of FIG. 5 employs circuitry with a storage feature such as is depicted in FIG. 2C including a transfer transistor and so includes a global transfer signal line serving the array. Persons of ordinary skill in the art will appreciate that arrays employing circuitry similar to that depicted in FIGS. 2A and 2B without storage and thus without a transfer transistor are also contemplated as within the scope of the present invention and that such arrays will not include a transfer signal line.

Common RESET and XFR lines can be provided for all of the VCF pixel sensors in the array. As presently preferred, a separate VSFD line is provided for each row in the array, although embodiments of the present invention having a single VSFD node are also contemplated. The source of the row select transistor for each color in FIGS. 2A through 2C in a column of the array is coupled to a separate column-output line associated with that column and the gate of all row select transistors for all colors for each VCF pixel sensor in a row of the array is coupled to a ROW-SELECT line associated with that row.

The 2 by 2 portion 120 of the array in FIG. 5 includes two rows and two columns of VCF pixel sensors. A first row includes VCF pixel sensors 122-1 and 122-2; a second row includes VCF pixel sensors 122-3 and 122-4. A first column includes VCF pixel sensors 122-1, 122-3; a second column includes VCF pixel sensors 122-2 and 122-4.

A first ROW-SELECT line 124-1 is connected to the row-select inputs (ROW-SELECT) of VCF pixel sensors 122-1 and 122-2. A second ROW-SELECT line 124-2 is connected to the row-select inputs (ROW-SELECT) of VCF pixel sensors 122-3 and 122-4. The first and second ROW-SELECT lines may be driven from a row decoder (not shown) as is well known in the art.

A first set of three (blue, green, and red) COLUMN-OUT lines 126-1 is connected to the outputs of VCF pixel sensors 122-1 and 122-3. A second set of three COLUMN-OUTPUT lines 126-2 is connected to the outputs of VCF pixel sensors 122-2 and 122-4. The first and second sets of COLUMN-OUTPUT lines are coupled to sets of column readout circuits (not shown) as is well known in the art.

A global RESET voltage line 128 is connected to the reset (R) inputs of all of the VCF pixel sensors 122-1 through 122-4. A first VSFD line 130-1 is connected to the VSFD inputs of the VCF pixel sensors 122-1 and 122-2 in the first row of the array. A second VSFD line 130-2 is connected to the VSFD inputs of the VCF pixel sensors 122-3 and 122-4 in the second row of the array. A global XFR line 132 is connected to the XFR inputs of all of the VCF pixel sensors 122-1 through 122-4.

A global PIX-VCC line 134 is connected to the PIX-VCC inputs of all of the VCF pixel sensors 122-1 through 122-4. Alternately, multiple PIX-VCC lines (one for each color) could be provided.

Figure 6A:
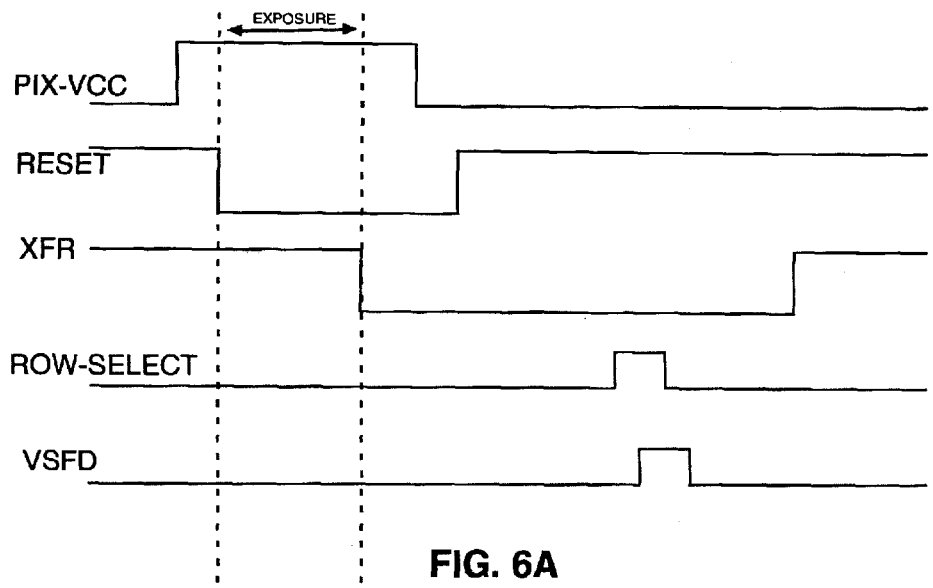
FIGS. 6A and 6B are timing diagrams that illustrate the operation of pixel sensors.

Referring now to FIG. 6A, a timing diagram illustrates the operation of the embodiment of the VCF pixel sensors shown in FIG. 2C of the present invention. Initially, the RESET signal is asserted high. The drains of the reset transistors 54b, 54g, and 54r are brought from zero volts to the voltage PIX-VCC. This action resets all VCF pixel sensors in the array by placing the voltage potential PIX-VCC at the cathode of each photodiode. According to one method for operating the VCF pixel sensors of the present invention illustrated in FIG. 6A, the voltage PIX-VCC is initially at a low level (e.g., to zero volts) while RESET is high to reset the cathode voltages of all photodiodes in the array to a low value to quickly equalize their states. Then the voltage PIX-VCC is raised (e.g., to about 2 volts) for a predetermined time (preferably on the order of a few milliseconds) while the RESET signal is still asserted to allow the photodiodes in all VCF pixel sensors to charge up to about 2.0 volts. The black level at the photodiode cathodes is thus set to PIX-VCC, less a little for the capacitive turn-off transient from the reset transistors.

When the RESET signal is de-asserted and photointegration begins, charge accumulates on the photodiode cathodes. The voltage at the source of the source-follower transistors 56b, 56g, and 56r, follows the voltage on their gates. In embodiments of the present invention that employ transfer transistors 59b, 59g, and 59r, the XFR signal is asserted throughout the reset period and the integration period and is de-asserted to end the integration period as illustrated in FIG. 6A. The low level of the XFR signal is preferably set to zero or a slightly negative voltage, such as about −0.2 volts, to thoroughly turn off transfer transistors 59b, 59g, and 59r.

To read out a pixel sensor, the drains of the source-follower transistors 56b, 56g, and 56r are driven to the voltage VSFD on the PixVCC line, the ROW-SELECT signal for the row of the array containing the transistors 59b, 59g, and 59r is asserted, and the output signal is thereby driven onto COLUMN-OUTPUT lines. The timing of the assertion of the VSFD voltage on the PixVCC signal is not critical, except that it should remain high until after the ROW-SELECT signal is de-asserted as illustrated in FIG. 6A. It may be advantageous to limit the voltage slope at the rising edge of the ROW-SELECT signal if VSFD is raised first on the PixVCC line, as disclosed in application Ser. No. 09/492,103, filed Feb. 14, 2000, now U.S. Pat. No. 6,410,899, issued on Jun. 25, 2002.

Figure 6B:
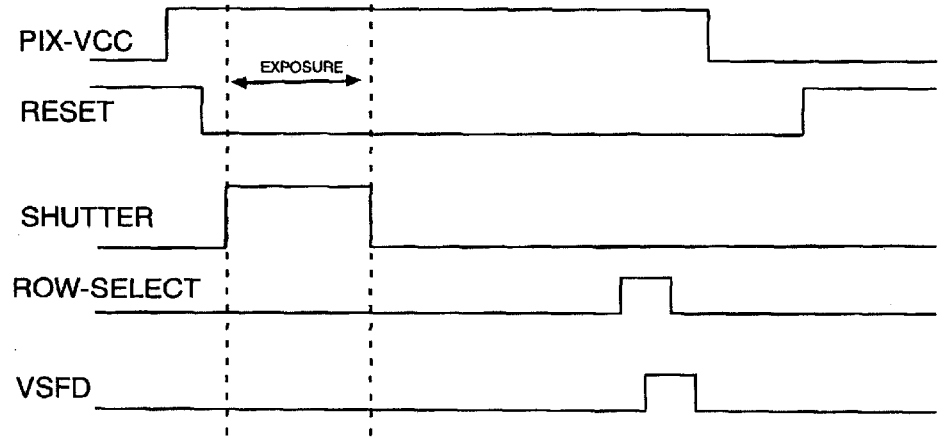

Referring now to FIG. 6B, a timing diagram illustrates one method for operating the sensor group realization of FIG. 2B. The reset operation proceeds as described relative to FIG. 6A. After RESET falls, exposure can begin; however, since without the XFR switch the active pixel sensor does not have an electronic shutter capability, it may be the case that a mechanical shutter is used to control the exposure. Accordingly, a SHUTTER signal is shown, indicative of a time when a shutter is letting light fall on the sensor. After the shutter closes, the RESET signal is not re-asserted as it was in FIG. 6A, since the signal needs to remain stored on the photodiode cathodes until after readout. Readout using ROW-SELECT and VSFD works as described with respect to FIG. 6A. After readout, PIX-VCC and RESET can be cycled back to their initial states.

As is well known in the art, there are other methods of operating 3-transistor active pixel sensors to avoid the need for a shutter.

The control signals depicted in FIGS. 6A and 6B may be generated using conventional timing and control logic. The configuration of the timing and control logic circuit will depend on the particular embodiment of the present invention, but in any event is conventional circuitry, the particular design of which is a trivial task for persons of ordinary skill in the art having examined FIGS. 6A and 6B once a particular embodiment of the present invention is selected.

Figure 7:
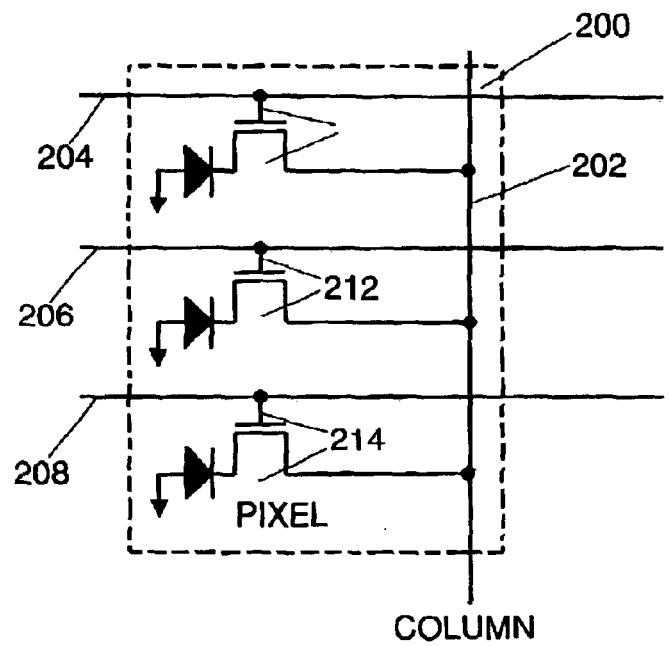
FIG. 7 is a schematic of a passive VCF pixel sensor.

FIG. 7 shows a passive VCF pixel sensor 200 having no amplifier. This results in a reduced number of components per pixel and improved fill factor. VCF pixel sensor has detector layers configured to collect photo-generated carriers of a first polarity, separated by additional intervening layers configured to collect and conduct away photo-generated carriers of the opposite polarity. The layers are disposed substantially in vertical alignment with each other and have different spectral sensitivities as a function of their different depths in the semiconductor substrate. VCF pixel sensor 200 includes a column-output line 202 and a plurality of color-enable lines 204, 206, and 208 associated with the different detector layers. Also included in VCF pixel sensor 200 is a plurality of color-enable transistors 210, 212, and 214. Each color-enable transistor is coupled between a different detector layer and the column-output line 202, and has a gate coupled to a different color-enable line.

The charge stored in the photodiodes must directly drive column-output line 202 that can have a higher capacitance than the photodiode. Thus, the voltage on column-output line 202 doesn't vary much when a photodiode value is read.

The operation of VCF pixel sensor 200 is as follows. Reset voltage $V_{ref}$ is driven onto the column-output line 202 through a switch (not shown), and signals on the three color-enable lines 204, 206, and 208 are asserted. This charges the photodiodes to a known voltage. If different reset voltages are desired for the different colors, they can be set in sequence by applying, for example, the red reset voltage to the column-output line 202 and asserting the red color-enable line 204, then driving the green reset voltage onto the column-output line 202 and asserting the green color-enable line 206 and likewise for blue. After an integration period, the voltage on the photodiodes decreases proportionally to the number of photons intercepted by each of the photodiodes. Sensor 200 is read out a row at a time and a color at a time by first charging column-output line 202 to a known voltage through a switch (not shown), and then asserting the red color-enable line 204 and reading the voltage difference on the column-output line 202. The column-output line 202 is charged to a known voltage, the green color-enable line 206 is asserted and the voltage difference on the column-output line 202 is read. These steps are repeated for blue. In an array of VCF pixels such as VCF pixel 200, the next row of pixels can be read out in the same way.

Figure 8:
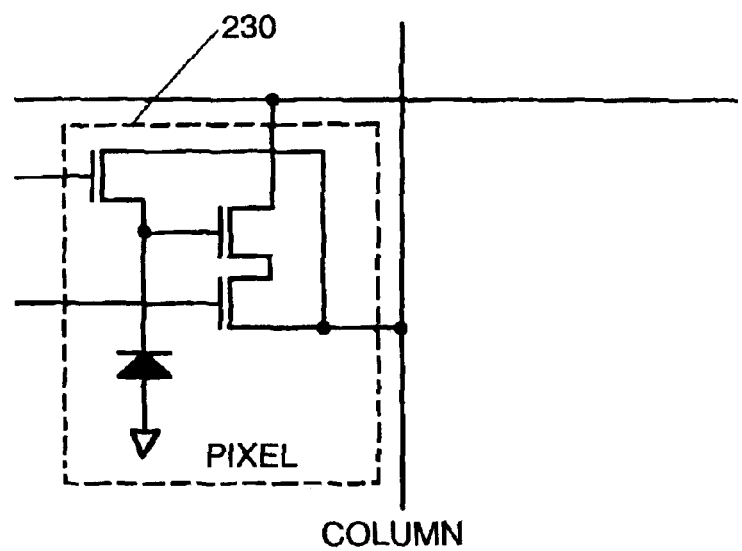
FIG. 8 is a schematic of a pixel sensor having a common line for pixel-reset voltage signals and column-output signals as shown in previous active pixel sensors.

FIG. 8 illustrates a pixel sensor 230 having a common line for pixel-reset voltage signals and column-output signals as shown in U.S. Pat. No. 5,654,537.

Figure 9:
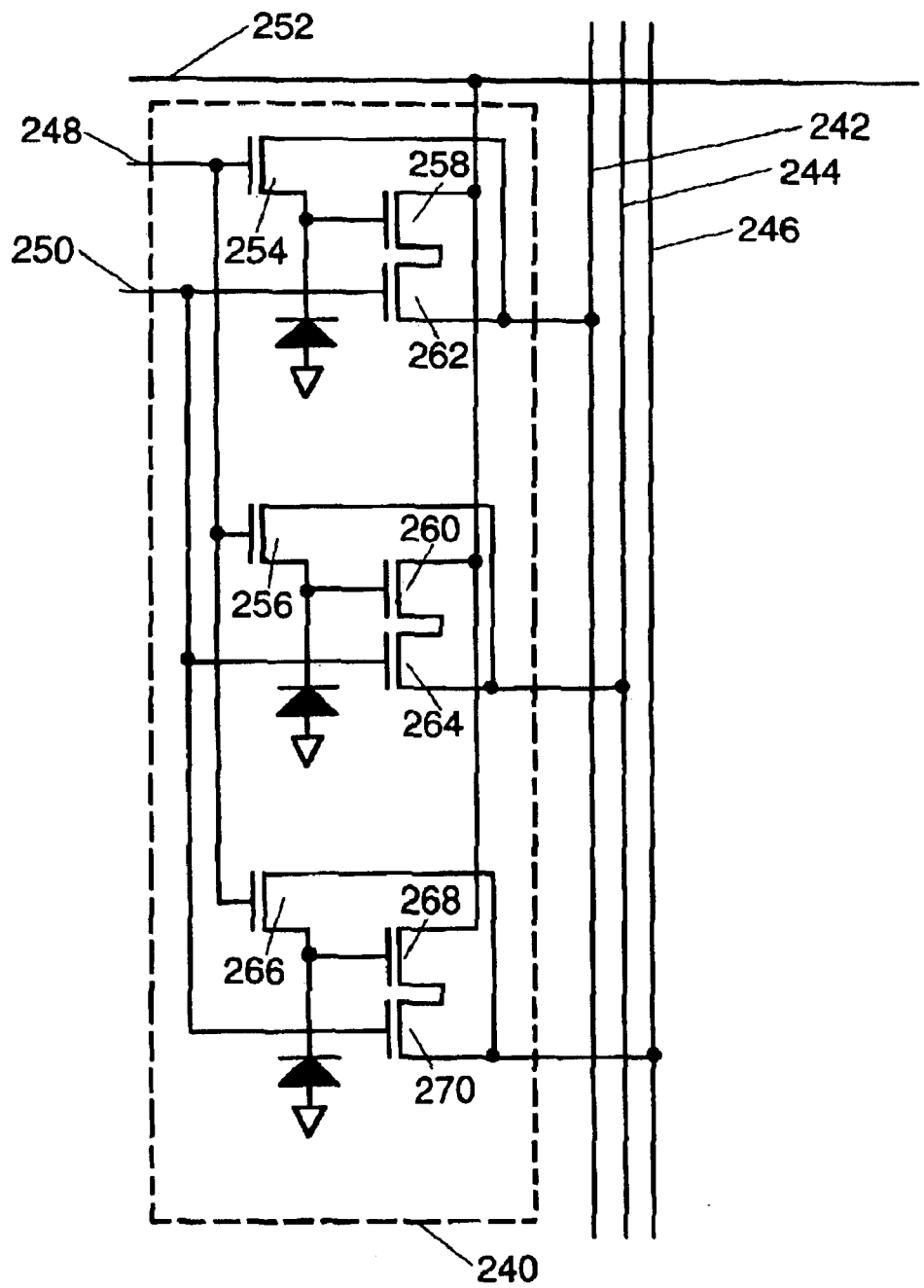
FIG. 9 is a schematic of a VCF pixel sensor having a common line for pixel-reset voltage signals and column-output signals.

FIG. 9 illustrates a VCF pixel sensor 240 having shared lines 242, 244, 246 for reset voltage $V_{ref}$ and column-output signals. This sharing removes one wire from the pixel sensor. VCF pixel sensor 240 also includes reset-signal line 248, row-enable line 250, and source-follower-drain-voltage line 252. Reset transistor 254 is coupled between a detector layer and column-output/reference-voltage line 242, and has a gate coupled to reset-signal line 248. Reset transistor 256 is coupled between a second detector layer and column-output/reference-voltage line 244, and has a gate coupled to reset-signal line 248. Source-follower transistor 258 has a gate coupled to the first detector layer, a drain coupled to source-follower-drain-voltage line 252, and a source.

Source-follower transistor 260 has a gate coupled to the second detector layer, a drain coupled to source-follower-drain-voltage line 252, and a source. Output-enable transistor 262 has a gate coupled to row-enable line 250, a drain coupled to the source of source-follower transistor 258, and a source coupled to column-output/reference-voltage line 242. Output-enable transistor 264 has a gate coupled to row-enable line 250, a drain coupled to the source of source-follower transistor 260, and a source coupled to column-output/reference-voltage line 244. If desired, a third detector layer can be included in VCF pixel sensor 240 with reset transistor 266, source-follower transistor 268 and output-enable transistor 270 arranged as described above.

During operation, the reset signal is driven high while a switch (not shown) connects the column-output lines to the reset voltage $V_{ref}$. This charges the photodiodes to a known voltage. Pixel sensor 240 is then is exposed to light for a fixed period of time. After this integration time the voltage on each photodiode decreases proportionally to the number of photons intercepted by each photodiode. Before reading out pixel sensor 240, the switch that connects reset voltage $V_{ref}$ to column-output lines 242, 244, and 246 is opened so that the pixels can drive the lines. Each photodiode in sensor 240 is connected to the input of a source-follower amplifier. The rows in the sensor are read out by driving the row-enable line high, thus connecting the pixel source-follower amplifier outputs to the column-output lines. Another advantage of VCF pixel sensor 240 is that the red, green, and blue photodiodes can be charged up to different voltages without having three reset voltage $V_{ref}$ lines, since there are three $V_{ref}$/column-output lines instead of only one reset voltage $V_{ref}$ line. This is useful since the photodiodes might respond differently to light or their leakage currents may be different.

Figure 10:
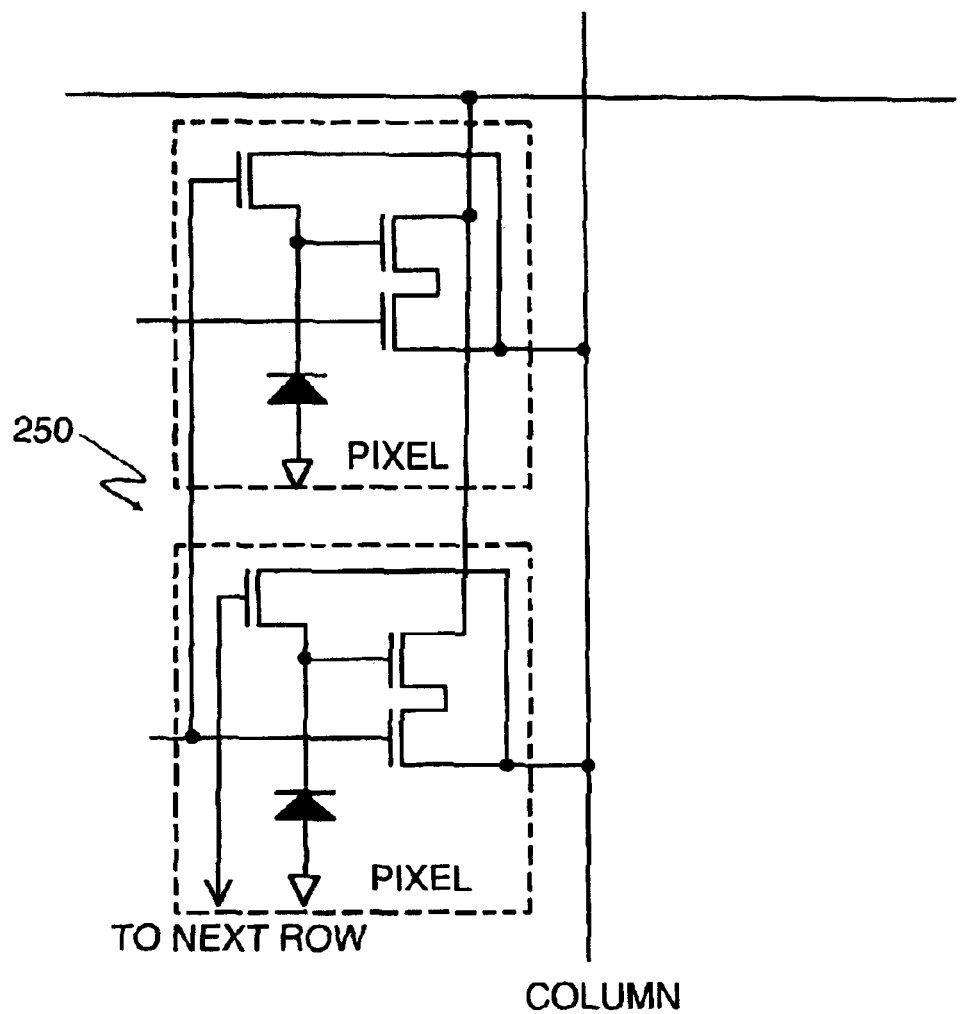
FIG. 10 is a schematic of a VCF pixel sensor having a shared line for the reset voltage signals and column-output signals and another shared line for the pixel-reset signals and row-enable signals as shown in previous active pixel sensors.

FIG. 10 illustrates two pixel sensors 250 having a row-enable line from one row connected to a reset voltage $V_{ref}$ line to another row as shown in U.S. Pat. No. 5,083,016.

Figure 11:
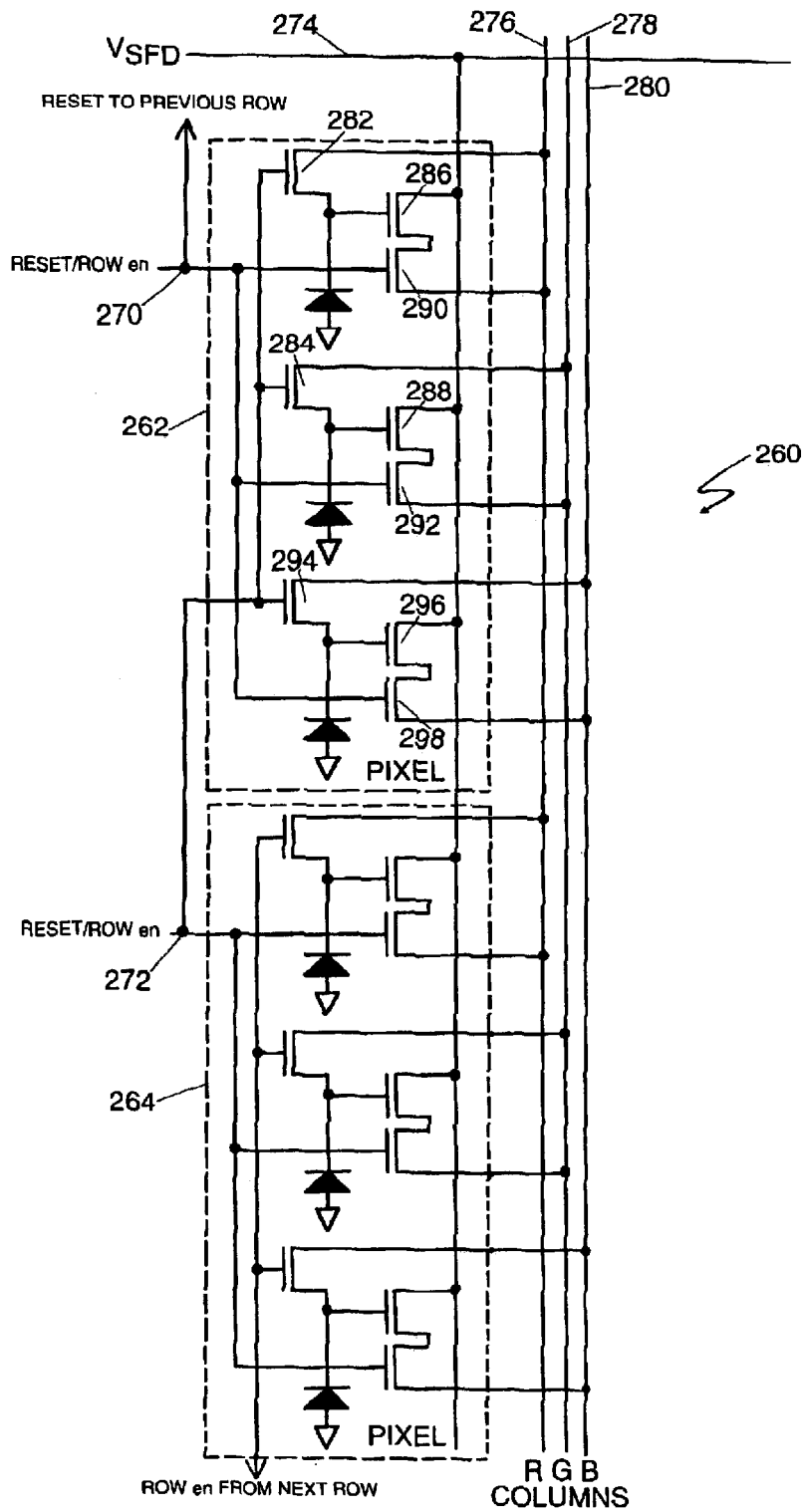
FIG. 11 is a schematic of a VCF pixel sensor having a shared line for pixel-reset signals and row-enable signals and another shared lines for the reset voltage and the column-output signals.

FIG. 11 illustrates how the reset voltage $V_{ref}$ line from one row can be combined with the row-enable line of a different row on lines 270, 272 in VCF pixel sensor array 260. This embodiment reduces congestion by removing a wire that has to go across the columns in an array of VCF pixel sensors 262, 264. This does not reduce the number of connections the pixel sensor makes to array 260, but this is still a very useful simplification if adjacent rows are used to share reset signals and row-enable signals. VCF pixel sensor array 260 includes reset-signal/row-enable line 270 associated with the row (m) of array 260, and a reset-signal/row-enable line 272 associated with a row (m+1) of array 260. VCF pixel sensor array 260 also includes source-follower-drain-voltage line 274, column-output/reference-voltage lines 276, 278, and 280, each associated with column (n) of array 260. Reset transistor 282 is coupled between the first detector layer and column-output/reference-voltage line 276 and has a gate coupled to reset-signal/row-enable line 272 associated with row (m+1) of array 260.

Reset transistor 284 is coupled between the second detector layer and column-output/reference-voltage line 278, and has a gate coupled to reset-signal/row-enable line 272 associated with row (m+1) of array 260.

Source-follower transistor 286 has a gate coupled to the first detector layer, a drain coupled to source-follower-drain-voltage line 274, and a source. Source-follower transistor 288 has a gate coupled to the second detector layer, a drain coupled to source-follower-drain-voltage line 274, and a source.

Output-enable transistor 290 has a gate coupled to reset-signal/row-enable line 270, a drain coupled to the source of source-follower transistor 286, and a source coupled to column-output/reference-voltage line 276. Output-enable transistor 292 has a gate coupled to reset-signal/row-enable line 270, a drain coupled to the source of source-follower transistor 288, and a source coupled to column-output/reference-voltage line 278.

Optionally, for three-color pixel sensors, a third reset transistor 294 can be coupled between a third detector layer and column-output/reference-voltage line 280. Reset transistor 294 has a gate coupled to reset-signal/row-enable line 272 associated with row (m+1) of array 260. Source-follower transistor 296 has a gate coupled to the third detector layer, a drain coupled to source-follower-drain-voltage line 274, and a source. Output-enable transistor 298 has a gate coupled to reset-signal/row-enable line 270, a drain coupled to the source of source-follower transistor 296, and a source coupled to column-output/reference-voltage line 280.

The act of reading out a row resets another row in array 260. Therefore if adjacent rows share the row-enable signals and reset signals, array 260 can only be read out in one direction so reading a row does not reset another row that has not yet been read out.

Figure 12:
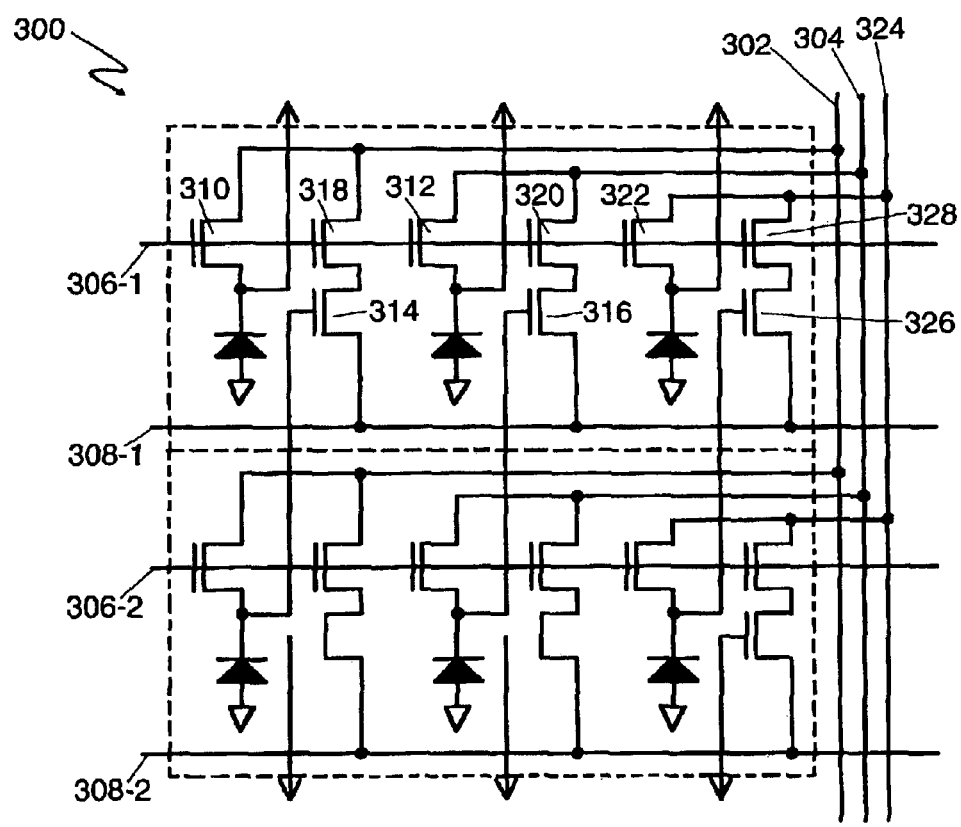
FIG. 12 is a schematic of a VCF pixel sensor array having an enhanced layout utilizing shared pixel reset and row-enable lines.

By changing which components are in each pixel sensor, a more efficient layout can be accomplished. FIG. 12 shows array 300 of VCF pixel sensor that are similar to VCF pixel sensor 260 except that the photodiodes are cross-connected to the adjacent row instead of the Reset/Row-enable line. This allows for a very compact layout of the six transistors that connect to the Reset/Row-enable line and also to the three column-output lines. The Reset/Row-enable line can be routed as one node within the pixel sensor and can be routed all in poly. If this optimization is not made, the interconnections within the pixel sensor occupy considerable area, resulting in a poor fill factor.

Array 300 includes a plurality of rows and columns of active VCF pixel sensors formed on a semiconductor substrate, an array column (n), including column-output/reference-voltage line 302 and column-output/reference-voltage line 304. Column (n) has a plurality of rows. Each row includes reset-signal/row-enable line 306, source-follower-drain-voltage line 308, and a pixel sensor. The pixel sensors include first and second detector layers disposed substantially in vertical alignment with each other, having different spectral sensitivities as a function of their different depths in the semiconductor substrate, and configured to collect photo-generated carriers of a first polarity. The first and second detector layers are separated by additional intervening layers configured to collect and conduct away photo-generated carriers of the opposite polarity.

Reset transistor 310 is coupled between the first detector layer and column-output/reference-voltage line 302, and has a gate coupled to reset-signal/row-enable line 306-1. Reset transistor 312 is coupled between the second detector layer and second column-output/reference-voltage line 304, and has a gate coupled to reset-signal/row-enable line 306-1. Source-follower transistor 314 has a gate, a drain coupled to source-follower-drain-voltage line 308-1, and a source.

Source-follower transistor 316 has a gate, a drain coupled to source-follower-drain-voltage line 308-1, and a source. Output-enable transistor 318 has a gate coupled to reset-signal/row-enable line 306-1, a drain coupled to the source of source-follower transistor 314, and a source coupled to column-output/reference-voltage line 302.

Output-enable transistor 320 has a gate coupled to reset-signal/row-enable line 306-1, a drain coupled to the source of source-follower transistor 316, and a source coupled to column-output/reference-voltage line 304.

The gate of source-follower transistor 314 in each pixel sensor in each row (m) in the column (n) is coupled to the first detector layer of the pixel sensor in row (m+1) in column (n), and the gate of source-follower transistor 316 in each pixel sensor in each row (m) in column (n) is coupled to the second detector layer of the pixel sensor in row (m+1) in column (n). The first and the last rows are different because there is no previous or next row respectively to interconnect. For the first row of the sensor there is nothing to connect the detector layers to and there are no detector layers to connect to the source-followers in the last row. There are a number of different ways to connect up the first and last rows. One possible implementation is to connect the detector layers from the first row to the source-followers in the last row. This however adds two or more signal lines from the top of the array to the bottom for each column in the array. Also since these signals will be long, they will pick up a lot of noise and resistive drop across the array will be large so the performance of the first row photo detectors would be poor. Another possible solution is to leave the photo detector layers in the first row unconnected and connect some other signal to the source-followers in the last row. Another solution is to leave out the photo detector layers and reset transistors from the first row and leave out the row-enable and source follower transistors from the last row. In most of these solutions no useful information is obtained from reading the last row so it should either not be read or the values should be ignored.

In a three-color embodiment of array 300, column (n) includes column-output/reference-voltage line 324. Each row further includes a third detector layer configured to collect photo-generated carriers of a first polarity. The third detector layer is separated from the first and second detector layers by additional intervening layers configured to collect and conduct away photo-generated carriers of the opposite polarity, and is disposed substantially in vertical alignment with the first and second detector layers and having a spectral sensitivity as a function of its depth in the semiconductor substrate.

Reset transistor 322 is coupled between the third detector layer and column-output/reference-voltage line 324, and has a gate coupled to reset-signal/row-enable line 306-1. Source-follower transistor 326 has a gate, a drain coupled to source-follower-drain-voltage line 308-1, and a source. Output-enable transistor 328 has a gate coupled to reset-signal/row-enable line 306-1, a drain coupled to the source of source-follower transistor 326, and a source coupled to column-output/reference-voltage line 324;

The gate of source-follower transistor 326 in each pixel sensor in each row (m) in the column (n) is coupled to the third detector layer of the pixel sensor in row (m+1) in column (n). The first and the last rows are different because there is no previous or next row respectively to interconnect. For the first row of the sensor there is nothing to connect the detector layers to and there are no detector layers to connect to the source-followers in the last row. There are a number of different ways to connect up the first and last rows. One possible implementation is to connect the detector layers from the first row to the source-followers in the last row. This however adds two or more signal lines from the top of the array to the bottom for each column in the array. Also since these signals will be long, they will pick up a lot of noise and resistive drop across the array will be large so the performance of the first row photo detectors would be poor. Another possible solution is to leave the photo detector layers in the first row unconnected and connect some other signal to the source-followers in the last row. Another solution is to leave out the photo detector layers and reset transistors from the first row and leave out the row-enable and source follower transistors from the last row. In most of these solutions no useful information is obtained from reading the last row so it should either not be read or the values should be ignored.

Figure 13:
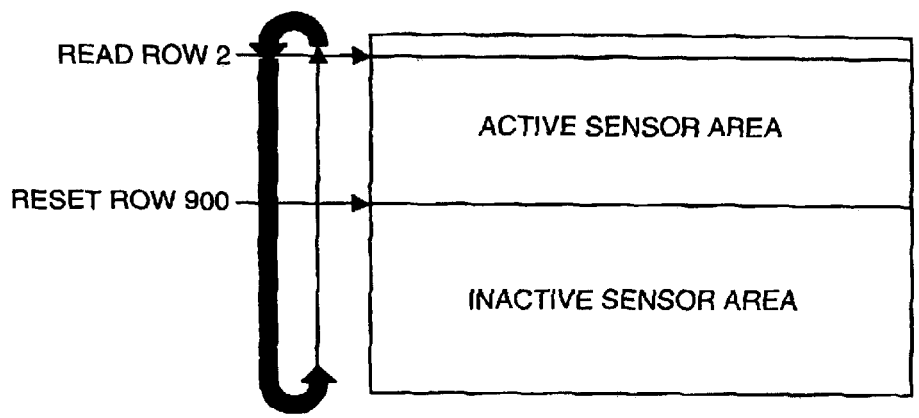
FIG. 13 is a diagram that illustrates operation of a sensor in rolling shutter and video mode.

FIG. 13 illustrates a rolling shutter mode in which pixel sensor arrays of the present invention can be used for video, very fast-exposure time photos, or long-exposure time photos, where the exposure time is longer than the time it would normally take to deplete the available charge on the photodiode, can still be implemented with this wiring simplification. When the exposure time is longer then the time it would normally take to deplete the photodiode, a sequence of rolling shutter images, each shorter then the time to deplete the photodiodes, can be added together to create a long exposure image. For a rolling shutter the row-enable for row n is connected to the reset for row n−1 with the row-enable line for the first row resetting the last row. In rolling shutter mode the resetting of the photodiodes' voltage for each row is interleaved with the reading out of other rows. To start this mode, the first row of the array is reset to a known voltage, followed by resetting the second row, resetting the third row, and so on. This reset process continues until the bottom of the array is reached and then it is started all over again at the top of the array. This reset process is performed repeatedly. Concurrent with the resetting of rows, different rows are also read out in sequential order. An integration time interval is defined as the time difference between when a row is reset and when it is read out. The integration time interval is equal to the amount of time that the shutter is open, or the time interval where photons that are collected are counted. Each row in the sensor has a different integration time because each row is reset and read out at different times. The rolling shutter mechanism works well for scenes with little movement that need a long exposure time.

For example, FIG. 13 shows the case where row 900 was just reset and row 2 is being read out, followed by resetting row 901 and reading row 3. In this example there is a "shutter" window 898 rows high that is rolling over the sensor.

Figure 14:
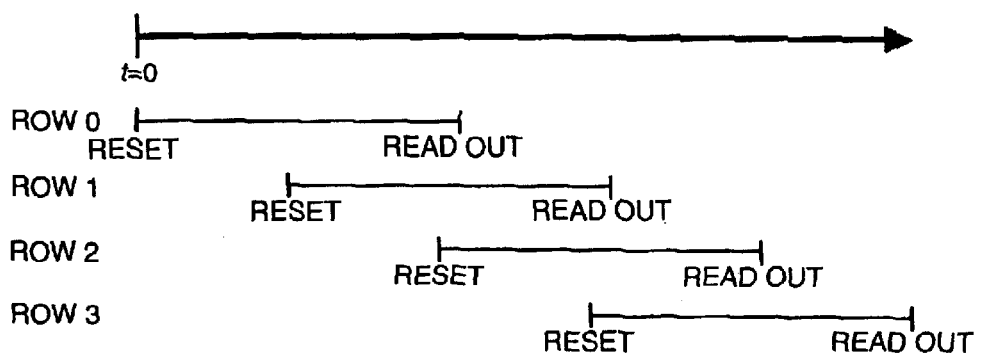
FIG. 14 is a diagram of a timeline illustrating rolling shutter mode integration timing.

FIG. 14 shows a time line where the integration time interval is the same for each row and the integration time for each row being different. The integration interval may be modified, depending on the amount of light to which the sensor is exposed. The integration interval can be changed by varying the number of rows between the reset and read operations. The integration time interval can also be increased by adding delays between each reset/read operation. For a long-exposure time photo, the rolling shutter window can be most of the sensor except two rows, the ones with interconnected row reset and row-enable. Therefore in rolling shutter mode, for most of the time during a long-exposure photo the photons intercepted are counted by the pixel sensor and only during a very short time while the pixel sensor is being reset and read out are the photons that are intercepted not counted.

As shown in FIG. 14, row n is read as row n−1 is reset. The reset operation is acceptable because row n−1 is in the inactive sensor area. The only limitation for connecting the row-enable line for row n to the reset voltage line for row n−1 is that the reset/read out operation can only occur in one direction, from top to bottom. There are many different ways of sharing reset and row-enable lines, each having different constraints on how the sensor gets reset and read out.

For video applications, each time the bottom row has been read out, a new frame has been captured. By changing the way reset and row-enable lines are shared, interlaced readout with a long integration period can be accomplished. For interlaced readout, the row-enable line for row n should be connected to the reset voltage $V_{ref}$ line for row n−2 instead of n−1. This allows the even or odd fields to be read out without affecting the other field. For long-exposure photos, the basic mechanism is the same as for rolling shutter mode except that as each frame is read out the values are added to an accumulation of the previous frames. The total accumulation then represents the values for the long-exposure picture.

Figure 15:
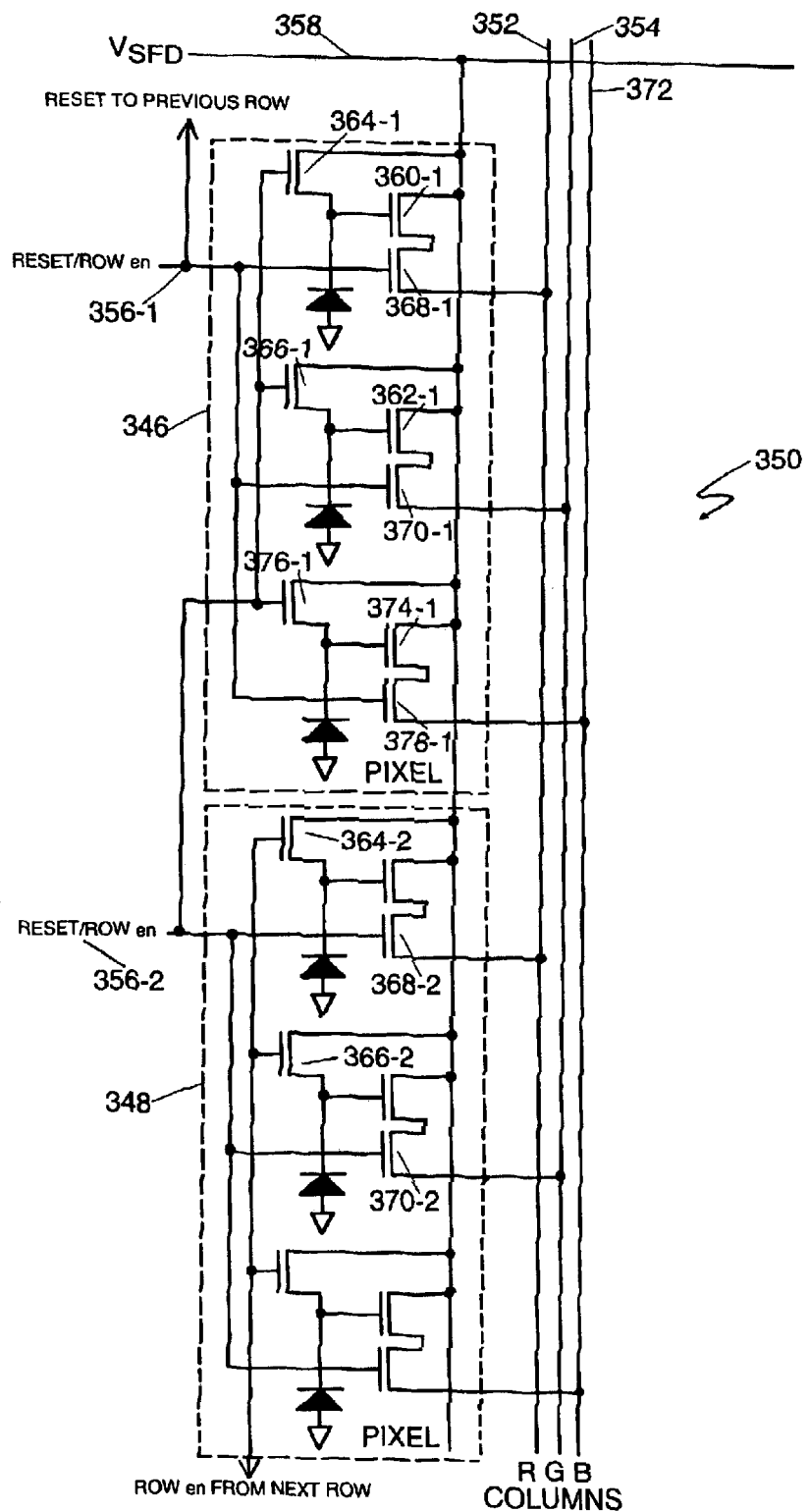
FIG. 15 is a schematic illustrating a VCF pixel sensor having a shared line for reset signals and row-enable signals and a shared line for reset voltage and source-follower voltage.

The reset voltage for this pixel sensor configuration can either be connected to the column-output lines as it is in pixel sensors illustrated in FIG. 13 or the $V_{SFD}$ line can accommodate the reset voltage as shown in VCF pixel sensors illustrated in FIG. 15. The advantage of using the column-output lines as shown in FIG. 13 is that the reset voltage for each of the different photodiodes in a pixel sensor can be different. This requires coordination between reset and read out since the column-output lines are used for both operations.

FIG. 15 illustrates array 350 including a plurality of rows and columns of active vertical-color-filter pixel sensors formed on a semiconductor substrate, an array column (n), including column-output line 352 and column-output line 354. Column (n) includes a plurality of rows, each row having reset-signal/row-enable line 356, source-follower-drain-voltage/reference-voltage line 358, and a pixel sensor. Each pixel sensor includes first and second detector layers disposed substantially in vertical alignment with each other, having different spectral sensitivities as a function of their different depths in the semiconductor substrate, and configured to collect photo-generated carriers of a first polarity. The first and second detector layers separated by additional intervening layers configured to collect and conduct away photo-generated carriers of the opposite polarity.

Reset transistor 364-1 is coupled between the first detector layer and source-follower-drain-voltage/reference-voltage line 358, and has a gate. Reset transistor 366-1 is coupled between the second detector layer and source-follower-drain-voltage/reference-voltage line 358, and has a gate. Source-follower transistor 360-1 has a gate coupled to the first detector layer, a drain coupled to source-follower-drain-voltage/reference-voltage line 358, and a source. Source-follower transistor 362-1 has a gate coupled to the second detector layer, a drain coupled to source-follower-drain-voltage/reference-voltage line 358, and a source.

Output-enable transistor 368-1 has a gate coupled to reset-signal/row-enable line 356-1, a drain coupled to the source of source-follower transistor 360-1, and a source coupled to column-output/reference-voltage line 352. Output-enable transistor 370-1 has a gate coupled to reset-signal/row-enable line 356-1, a drain coupled to the source of source-follower transistor 362-1, and a source coupled to column-output/reference-voltage line 354;

The gates of reset transistors 364-1, 366-1 in each pixel sensor in each row (m) in column (n) are coupled to reset-signal/row-enable line 356-2 of the pixel sensor in row (m+1) in column (n). There is no signal to drive the reset transistors in the last row since normally this signal come from the next row. There are a number of different ways to deal with this. One way is to connect the reset transistors in the last row to the row enable signal 356-1 from the first row. Another solution would be to create another signal, which is the logic equivalent of the Reset/Row_en signal 356-1 for the first row in the array, which is routed after the last row in the array and connected to the reset transistors in the last row of the array. Another solution is to tie the reset transistors in the last row to a static value and not use the values from the last row since the reset will not operate properly.

For a three-color VCF pixel embodiment, array 350 includes a third column-output line 372. Each row also includes a third detector layer configured to collect photo-generated carriers of a first polarity. The third detector layer is separated from the first and second detector layers by additional intervening layers configured to collect and conduct away photo-generated carriers of the opposite polarity. The third detector layer is disposed substantially in vertical alignment with the first and second detector layers and has a spectral sensitivity as a function of its depth in the semiconductor substrate.

Reset transistor 376-1 is coupled between the third detector layer and source-follower-drain-voltage/reference-voltage line 358 and has a gate. Source-follower transistor 374-1 has gate coupled to the third detector layer, a drain coupled to source-follower-drain-voltage/reference-voltage line 358, and a source. Output-enable transistor 378-1 has a gate coupled to reset-signal/row-enable line 356-1, a drain coupled to the source of source-follower transistor 374-1, and a source coupled to column-output/reference-voltage line 372.

The gate of reset transistor 376-1 in each pixel sensor in each row (m) in the column (n) is coupled to reset-signal/row-enable line 356-2 of the pixel sensor in row (m+1) in column (n). There is no signal to drive the reset transistors in the last row since normally this signal come from the next row. There are a number of different ways to deal with this. One way is to connect the reset transistors in the last row to the row enable signal 356-1 from the first row. Another solution would be to create another signal, which is the logic equivalent of the Reset/Row_en signal 356-1 for the first row in the array, which is routed after the last row in the array and connected to the reset transistors in the last row of the array. Another solution is to tie the reset transistors in the last row to a static value and not use the values from the last row since the reset will not operate properly.

Figure 16:
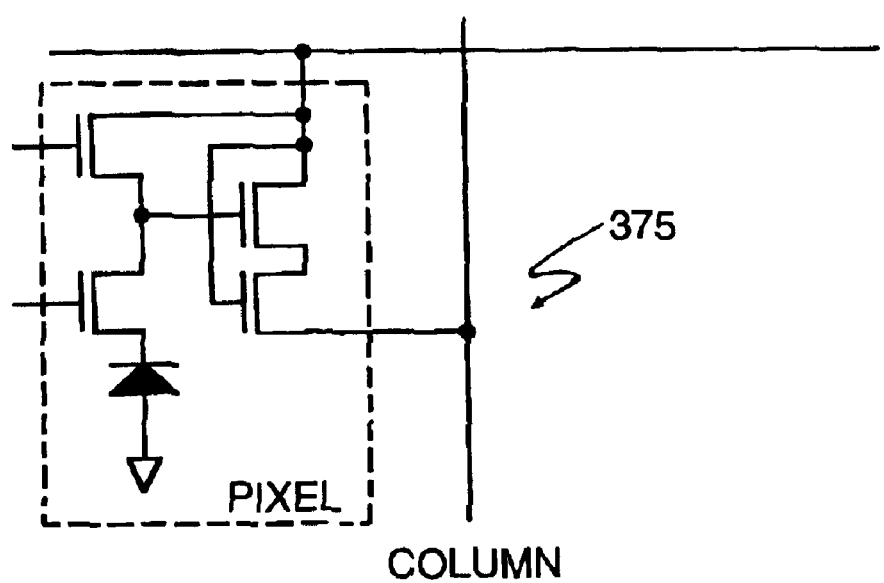
FIG. 16 is a schematic illustrating a pixel sensor having a shared reset voltage, source-follower voltage, and row-enable line as taught in prior art.

FIG. 16 illustrates a pixel sensor 375 having a shared line for row-enable, $V_{ref}$ and $V_{SFD}$ as shown in U.S Pat. No. 5,949,061.

Figure 17:
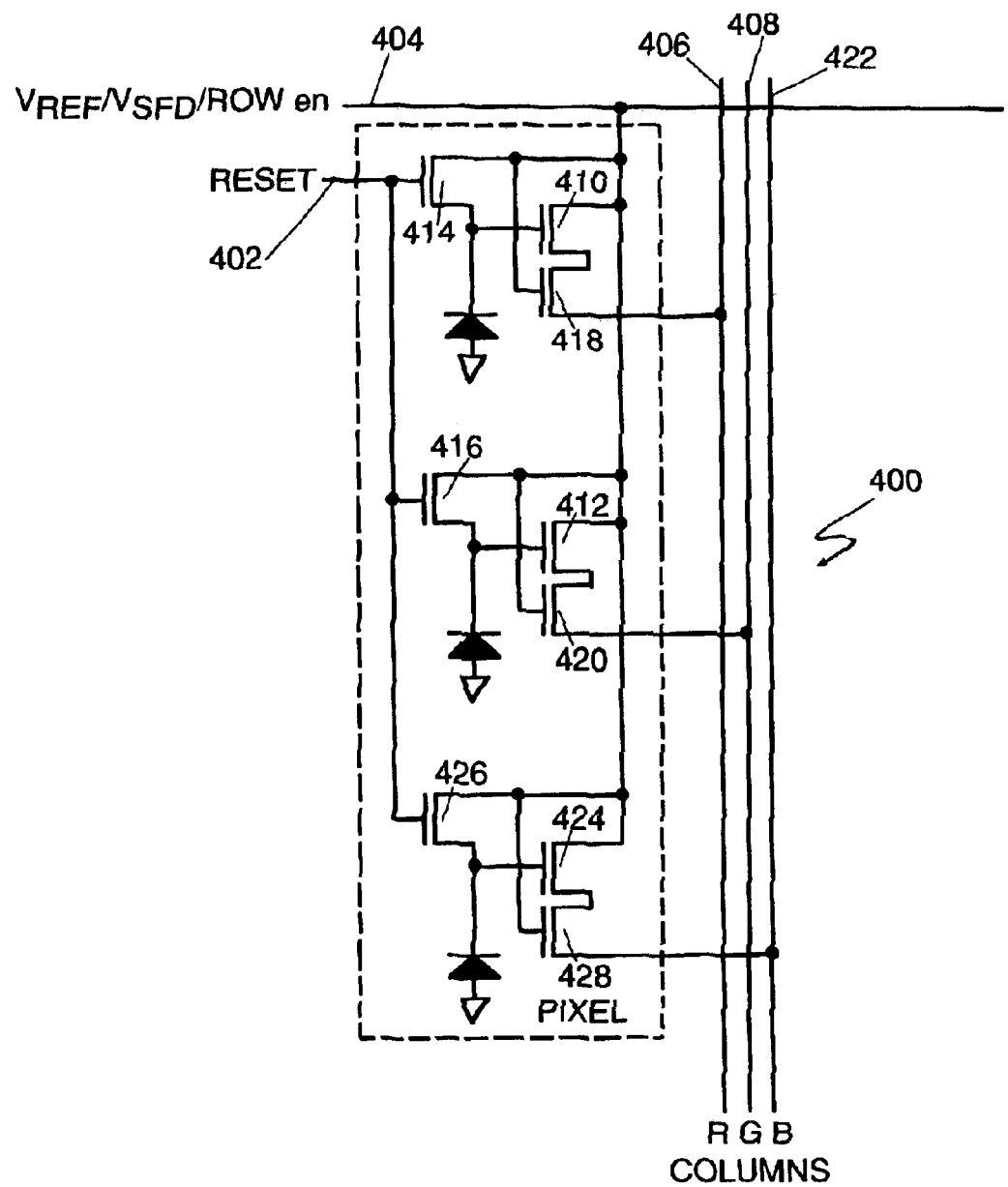
FIG. 17 is a schematic illustrating a VCF pixel sensor having a shared reset voltage, source-follower voltage, and row-enable line.

Row-enable signals, $V_{ref}$ and $V_{SFD}$ can also share a line in a VCF pixel sensor 400 as illustrated in FIG. 17. This simplification is useful because it reduces the number of wires in an array of pixel sensors by one and likewise the number of connections from the pixel sensor to array wires by one as well.

FIG. 17 illustrates active VCF pixel sensor 400 formed on a semiconductor substrate that has first and second detector layers configured to collect photo-generated carriers of a first polarity. The first and second detector layers are separated by additional intervening layers configured to collect and conduct away photo-generated carriers of the opposite polarity. The first and second detector layers are disposed substantially in vertical alignment with each other and have different spectral sensitivities as a function of their different depths in the semiconductor substrate.

Also included in pixel sensor 400 is reset-signal line 402, source-follower-drain-voltage/reference-voltage/row-enable line 404, and column-output lines 406 and 408.

Reset transistor 414 is coupled between the first detector layer and source-follower-drain-voltage/reference-voltage/ row-enable line 404, and has a gate coupled to reset-signal line 402. Reset transistor 416 is coupled between the second detector layer and source-follower-drain-voltage/reference-voltage/row-enable line 404, and has a gate coupled to reset-signal line 402.

Source-follower transistor 410 has a gate coupled to the first detector layer, a drain coupled to source-follower-drain-voltage/reference-voltage/row-enable line 404, and a source. Source-follower transistor 412 has a gate coupled to the second detector layer, a drain coupled to source-follower-drain-voltage/reference-voltage/row-enable line 404, and a source.

Output-enable transistor 418 has a gate coupled to source-follower-drain-voltage/reference-voltage/row-enable line 404, a drain coupled to the source of source-follower transistor 410, and a source coupled to column-output line 406.

Output-enable transistor 420 has a gate coupled to source-follower-drain-voltage/reference-voltage/row-enable line 404, a drain coupled to the source of source-follower transistor 412, and a source coupled to column-output line 408.

For a three-color embodiment of array 400, a third detector layer is configured to collect photo-generated carriers of a first polarity. The third detector layer is separated from the first and second detector layers by additional intervening layers configured to collect and conduct away photo-generated carriers of the opposite polarity. The third detector layer is disposed substantially in vertical alignment with the first and second detector layers and has a spectral sensitivity as a function of its depth in the semiconductor substrate.

Also included in array 400 is column-output line 422, reset transistor 426 coupled between the third detector layer and source-follower-drain-voltage/reference-voltage/row-enable line 404. Reset transistor 426 has a gate coupled to reset-signal line 402. Source-follower transistor 424 has a gate coupled to the third detector layer, a drain coupled to source-follower-drain-voltage/reference-voltage/row-enable line 404, and a source. Output-enable transistor 428 has a gate coupled to source-follower-drain-voltage/reference-voltage/row-enable line 404, a drain coupled to the source of source-follower transistor 424, and a source coupled to column-output line 422.

The operation of VCF pixel sensor 400 is as follows. First the $V_{ref}/V_{SFD}$/row-enable signal is driven to the level required to reset the pixel sensor to the desired voltage. The reset signal is also driven high. The row-reset signal can then be driven low followed by $V_{ref}/V_{SFD}$/Row_en. After an integration period, the voltage on the photodiodes decreases proportionally to the number of photons intercepted by each photodiode. To read out the pixel sensor, the $V_{ref}/V_{SFD}$/row-enable signal is driven high which makes the source-follower amplifier operational as well as enables the row-enable transistor so that the pixel sensor can drive the column-output lines.

Figure 18:
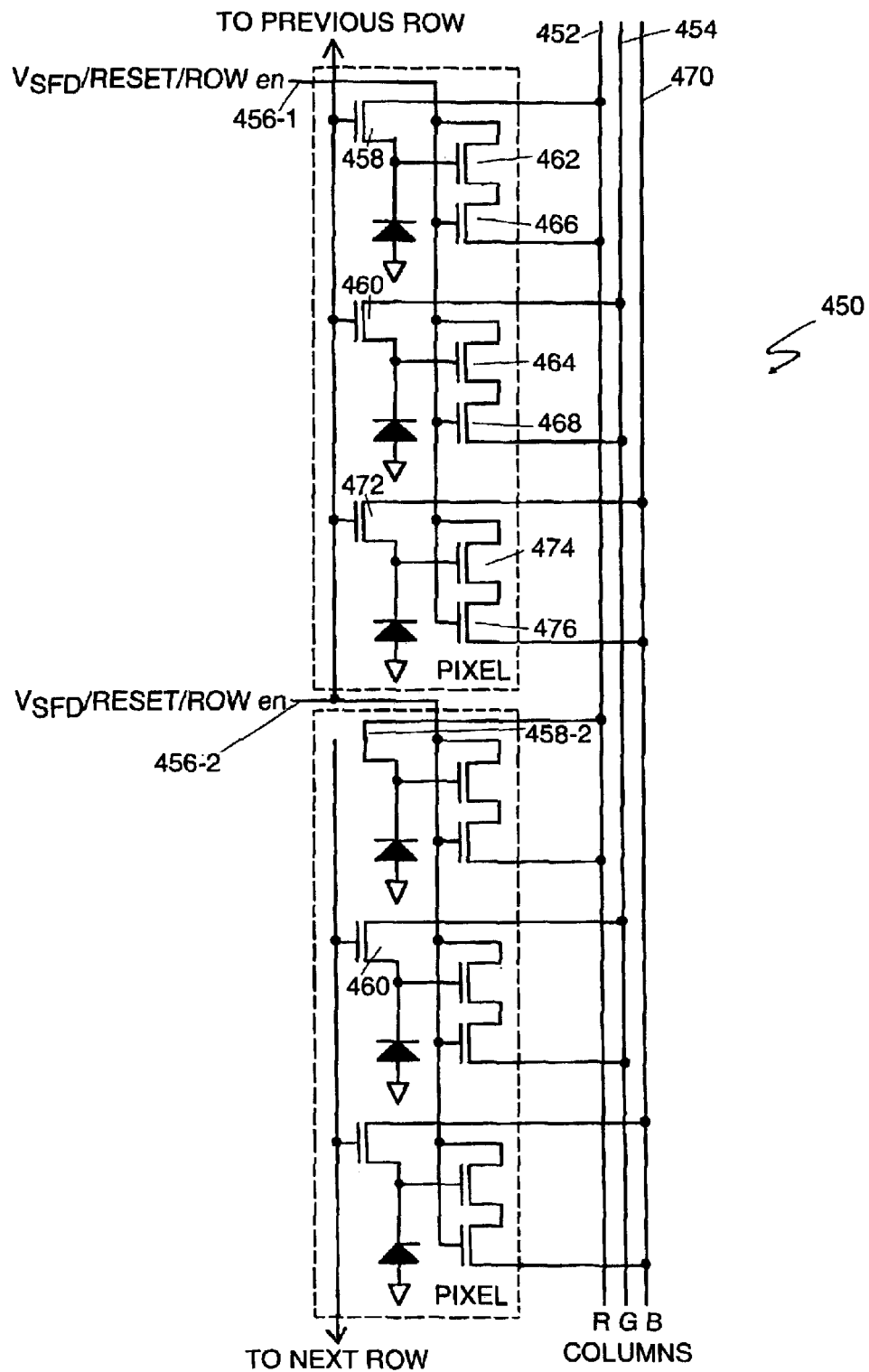
FIG. 18 is a schematic illustrating a simplified VCF pixel sensor having shared reset, source-follower voltage, and row-enable lines and shared reset voltage and column-output lines.

It is also possible to combine the three pixel wiring simplifications into one VCF pixel sensor array 450, as shown in FIG. 18. As shown in FIG. 18, the reset voltage $V_{ref}$ line is shared with column-output lines 452, 454, and 470. This allows different pixel reset voltages for the different photodiodes in each pixel. Again this can be useful if the different photodiodes' responses are different. VCF pixel sensors in array 450 also share the reset line for row n with the row-enable line with row n+1. Another simplification in the VCF pixel sensors in array 450 is that the source-follower-voltage $V_{SFD}$ and row-enable signals also are shared. This signal also happens to be shared with the reset for a different row in the pixel sensor array. The combination of these three simplifications has reduced the number of wires in the pixel sensor array from seven to four.

Array 450 includes a plurality of rows and columns of active vertical-color-filter pixel sensors formed on a semiconductor substrate, an array column (n), including column-output/reference-voltage line 452 and column-output/reference-voltage line 454. The column (n) includes a plurality of rows, each row having a reset-signal/row-enable/source-follower-drain-voltage line 456. Each pixel sensor includes first and second detector layers disposed substantially in vertical alignment with each other that have different spectral sensitivities as a function of their different depths in the semiconductor substrate, and are configured to collect photo-generated carriers of a first polarity. The first and second detector layers are separated by additional intervening layers configured to collect and conduct away photo-generated carriers of the opposite polarity.

Reset transistor 458 is coupled between the first detector layer and column-output/reference-voltage line 452, and has a gate. Reset transistor 460 is coupled between the second detector layer and column-output/reference-voltage line 454, and has a gate. Source-follower transistor 462 has a gate coupled to the first detector layer, a drain coupled to reset-signal/row-enable/source-follower-drain-voltage line 456, and a source. Source-follower transistor 464 has a gate coupled to the second detector layer, a drain coupled to reset-signal/row-enable/source-follower-drain-voltage line 456, and a source. Output-enable transistor 466 has a gate coupled to reset-signal/row-enable/source-follower-drain-voltage line 456, a drain coupled to the source of source-follower transistor 462, and a source coupled to column-output/reference-voltage line 452. Output-enable transistor 468 has a gate coupled to reset-signal/row-enable/source-follower-drain-voltage line 456, a drain coupled to the source of source-follower transistor 464, and a source coupled to column-output/reference-voltage line 454. The gates of reset transistors 458, 460 in each pixel sensor in each row (m) in the column (n) are coupled to reset-signal/row-enable/source-follower-drain-voltage line 456-2 of the pixel sensor in row (m+1) in column (n). There is no signal to drive the reset transistors in the last row since normally this signal come from the next row. There are a number of different ways to deal with this. One way is to connect the reset transistors in the last row to the $V_{SFD}$/Reset/row enable signal 456-1 from the first row. A better solution would be to create another signal, which is the logic equivalent of the $V_{SFD}$/Reset/Row_en signal 456-1 for the first row in the array, which is routed after the last row in the array and connected to the reset transistors in the last row of the array. Another solution is to tie the reset transistors in the last row to a static value and not use the values from the last row since the reset will not operate properly.

Array 450 can also be implemented to accommodate three detector layers. In such an embodiment, column (n) further includes a third column-output/reference-voltage line 470. Each row of array 450 further includes a third detector layer configured to collect photo-generated carriers of a first polarity. The third detector layer is separated from the first and second detector layers by additional intervening layers configured to collect and conduct away photo-generated carriers of the opposite polarity. The third detector layer is disposed substantially in vertical alignment with the first and second detector layers and has a spectral sensitivity as a function of its depth in the semiconductor substrate.

Reset transistor 472 is coupled between the third detector layer and source-follower-drain-voltage/reference-voltage line 456, and has a gate. Source-follower transistor 474 has a gate coupled to the third detector layer, a drain coupled to reset-signal/row-enable/source-follower-drain-voltage line 456, and a source. Output-enable transistor 476 has a gate coupled to reset-signal/row-enable/source-follower-drain-voltage line 456, a drain coupled to the source of source-follower transistor 474, and a source coupled to third column-output/reference-voltage line 470. The gate of third reset transistor 472 in each pixel sensor in each row (m) in the column (n) is coupled to reset-signal/row-enable/source-follower-drain-voltage line 456-2 of the pixel sensor in row (m+1) in column (n). There is no signal to drive the reset transistors in the last row since normally this signal come from the next row. There are a number of different ways to deal with this. One way is to connect the reset transistors in the last row to the $V_{SFD}$/Reset/row enable signal 456-1 from the first row. Another solution would be to create another signal, which is the logic equivalent of the $V_{SFD}$/Reset/Row_en signal 456-1 for the first row in the array, which is routed after the last row in the array and connected to the reset transistors in the last row of the array. Another solution is to tie the reset transistors in the last row to a static value and not use the values from the last row since the reset will not operate properly.

The first step in operating the pixel sensors in array 450 is to charge up the photodiodes to a known voltage. This is done by driving the $V_{SFD}$/reset/row-enable signal for a row or the whole array high while at the same time driving the $V_{ref}$ voltages for each color on the column-output lines. Then the $V_{SFD}$/reset/row-enable signal can be de-asserted. After a given integration period, the voltage on each of the photodiodes will have decreased proportional to the number of photons intercepted by each of the photodiode. Array 450 can then be read out one row at a time by asserting $V_{SFD}$/reset/row-enable signal for a row that is also the $V_{SFD}$ voltage for the source-follower amplifiers. The $V_{SFD}$/reset/row-enable signal will also turn on the row-enable gates for one row. The pixel values can then be read out for one row. The photodiode in the row that shares the reset/row-enable signal and uses it for the reset function is reset to a value proportional to the values being read from the row that uses the reset/row-enable signal for row-enable. The order that the rows are read out is performed such that the row being reset has already been read out. This works for every row except for the first row unless the pixel sensor is constructed such that it does not share its row-enable line with the reset voltage $V_{ref}$ line of another row. Once the read out operation for a row is complete that reset/row-enable signal can be driven low and a different reset/row-enable can be driven high to read out that row.

To operate pixel sensor 450 in rolling shutter mode, the array is reset a row at a time in the same order as it is read out, usually from the top to the bottom, by driving the $V_{ref}$ voltage for each of the colors on the column-output lines and asserting the $V_{SFD}$/reset/row-enable signal for each of the rows. Sequential rows are reset one at a time. When the bottom of the array is reached the first row is reset again. This is repeated over and over again. After the integration interval time from when the first row was reset, the readout can begin with the first row and continue sequentially through the array. The column-output lines are driven with the reset voltage $V_{ref}$ for each of the colors when a row is being reset and are not driven with reset voltage $V_{ref}$ when a row is being read out. The readout of this row is performed as before. After a row is read, a different $V_{SFD}$/Reset/Row-en signal is asserted to reset a row and then another row is read. The pixel sensor alternates between reading a row and resetting a row. This must be coordinated since the column-output lines are used for reading out rows as well as providing the reset voltage, $V_{ref}$. The integration interval is the time difference between when a row is reset and when it is read out. Each row in array 450 has a different integration period since each row is reset and read out at different times.

There are also advantages to reducing the number of column-output lines that a pixel connects to at the cost of adding transistors to each pixel. Reducing the number of column-output lines also reduces the number of row-enable gates that drive the column-output lines. If a row-enable gate has high leakage, the values for all pixels on that column-output line are affected. This configuration reduces the number of row-enable transistors in the chip, and therefore improves the yield of parts with low leakage through the row-enable gates. These optimizations are unique to the VCF pixel sensor since it has three photodiodes and usually three row-enable gates per pixel.

Figure 19:
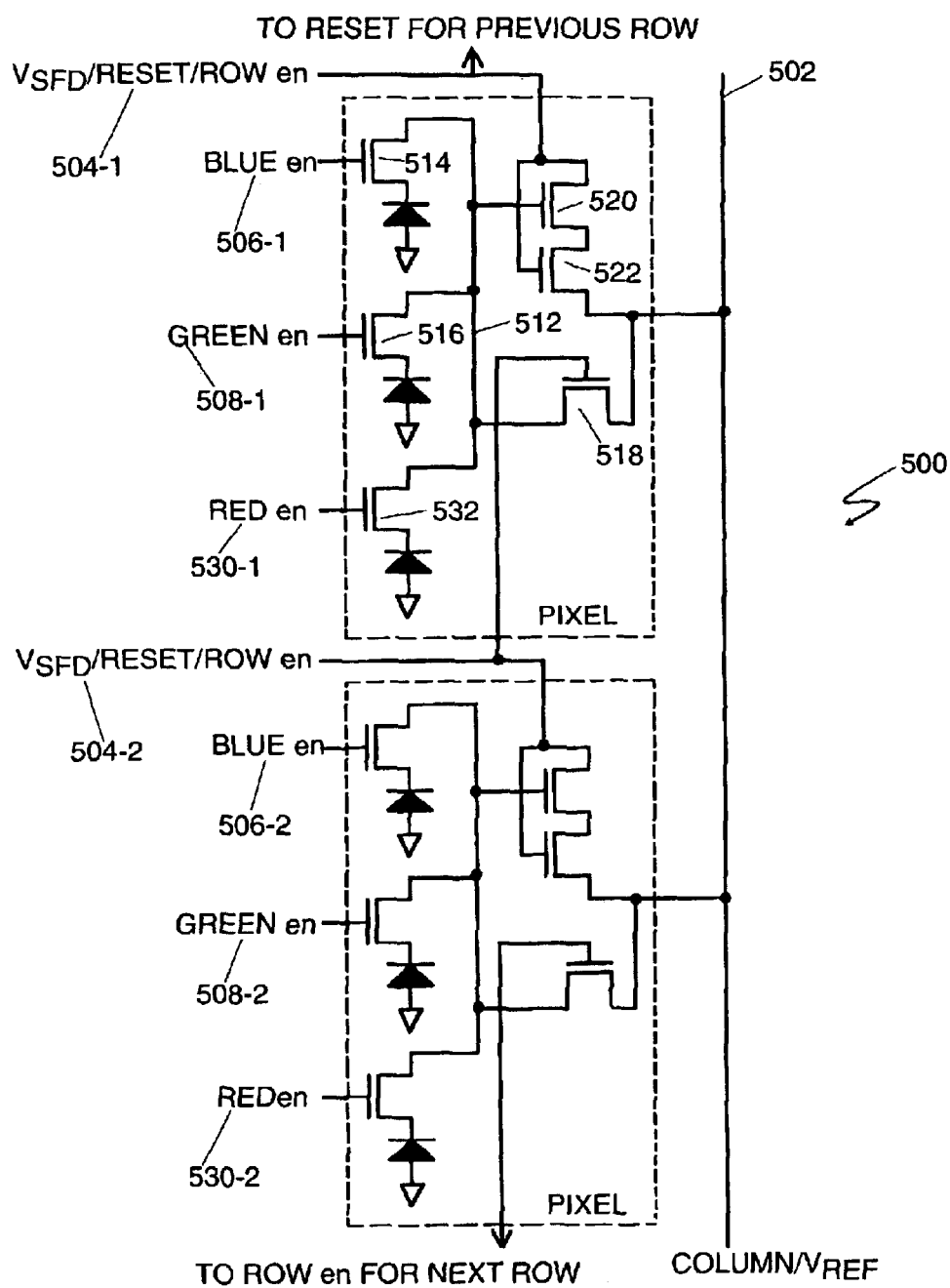
FIG. 19 is a schematic illustrating a VCF pixel sensor with one output line that is also used for the pixel reset voltage and shared reset, source-follower voltage, and row-enable lines.

FIG. 19 illustrates array 500 of active VCF pixel sensors formed on a semiconductor substrate. Array 500 includes an array column (n), and a column-output/reference-voltage $V_{ref}$ line 502. Column (n) includes a plurality of rows, each including reset-signal/row-enable/source-follower-drain-voltage line 504, color-enable line 506, color-enable line 508; and a pixel sensor. Each pixel sensor includes first and second detector layers disposed substantially in vertical alignment with each other, having different spectral sensitivities as a function of their different depths in the semiconductor substrate are configured to collect photo-generated carriers of a first polarity. The first and second detector layers are separated by additional intervening layers configured to collect and conduct away photo-generated carriers of the opposite polarity. Also included is photocharge-output-signal node 512.

Color-enable transistor 514 is coupled between the first detector layer and photocharge-output-signal node 512, and has a gate coupled to color-enable line 506. Color-enable transistor 516 is coupled between the second detector layer and photocharge-output-signal node 512, and has a gate coupled to color-enable line 508.

Reset transistor 518 is coupled between photocharge-output-signal node 512 and column-output/reference-voltage line 502, and has a gate. Source-follower transistor 520 has a gate coupled to photocharge-output-signal node 512, a drain coupled to reset-signal/row-enable/source-follower-drain-voltage line 504, and a source. Output-enable transistor 522 has a gate coupled to reset-signal/row-enable/source-follower-drain-voltage line 504, a drain coupled to the source of source-follower transistor 520, and a source coupled to column-output/reference-voltage line 502.

The gate of reset transistor 518 in each pixel sensor in each row (m) in the column (n) is coupled to the reset-signal/row-enable/source-follower-drain-voltage line 504-2 of the pixel sensor in row (m+1) in column (n). There is no signal to drive the reset transistors in the last row since normally this signal come from the next row. There are a number of different ways to deal with this. One way is to connect the reset transistors in the last row to the $V_{SFD}$/Reset/row enable signal 504-1 from the first row. Another solution would be to create another signal, which is the logic equivalent of the $V_{SFD}$/Reset/Row_en signal 504-1 for the first row in the array, that is routed after the last row in the array and connected to the reset transistors in the last row of the array. Another solution is to tie the reset transistors in the last row to a static value and not use the values from the last row since the reset will not operate properly.

Array 500 can also be implemented to accommodate three detector layers. In such an embodiment, column (n) further includes color-enable line 530. A third detector layer configured to collect photo-generated carriers of a first polarity, which is separated from the first and second detector layers by additional intervening layers configured to collect and conduct away photo-generated carriers of the opposite polarity. The third detector layer is disposed substantially in vertical alignment with the first and second detector layers and has a spectral sensitivity as a function of its depth in the semiconductor substrate. Color-enable transistor 532 is coupled between the third detector layer and photocharge-output-signal node 512, and has a gate coupled to color-enable line 530.

The operation of pixel sensors in array 500 requires control of the enable lines 506, 508, 530, one per color that needs to be controlled. Column-output line 502 is also used for the reset voltage $V_{ref}$ line. To reset the photodiode, column-output line 502 is driven by the $V_{ref}$ value and the reset/row-enable signal is asserted. Signals on the three color-enable lines 506, 508, 530 can be asserted if all of the photodiodes are to be charged up to the same value or they can be enabled in sequence, changing the reset voltage $V_{ref}$ voltage being driven on column-output line 502 for each color. The pixel sensor is exposed to light for a given integration time. After the integration time the photodiodes' voltage will have dropped proportionally to the number of photons that were intercepted by each of the photodiodes. The gate of the source-follower amplifier needs to be set to a known voltage before the pixel values are read out.

This is done by asserting the reset signal for the row to be read and driving the desired voltage onto column-output line 502, while at the same time keeping enable lines 506, 508, 530 deasserted. Then reset signal can be deasserted and column-output line 502 can float. The $V_{SFD}$, reset signal and row-enable are all shared on line 504. Therefore, to read a row the VSFD/reset/row-enable signal for the right row is driven high. This makes the source-follower amplifier operational and enables the row-enable gate. Then one of the photodiodes is enabled with the enable lines 506, 508, and 530. Column-output line 502 should be sampled while the $V_{SFD}$/Reset/row-enable signal is still asserted and not count on the charge stored in column-output line 502 to hold its value since a slow falling transition on the VSFD/Reset/row-enable line will cause uncertainty in the value stored on column-output line 502. Before reading out a different photodiode the gate of the source-follower amplifier should again be set to a known voltage as described above. Then the next photodiode can be read out. Pixel sensors in array 500 may also be operated in rolling shutter mode but the photodiodes need to be read out in sequence instead of in parallel since the pixel is connected to only one column-output line.

To cancel the fixed pattern noise caused by threshold variation in the source follower amplifier, for example, one can perform additional reads to measure the fixed pattern noise and then subtract this noise from the pixel values that are read. This is done by reading the value on the column-output after the photocharge-output-signal node is reset, to the same level that the photodiode was reset to before the start of integration, but before one of the color enables are reset. Then, one of the color enables are asserted and the pixel values are read. By subtracting the pixel value that was read from the photocharge-output-signal node reset value that was read, the fixed pattern noise will be cancelled.

It is also possible to build an APS sensor where some of the detector layers are larger (area in the horizontal plane) then the other detector layers of the type disclosed in U.S. patent application Ser. No. 10/103,304 to Merrill et al. and to [Reference Fov-122]. This would be done to make a pixel structure that has a much better fill factor. For example, a pixel could contain one red and one blue detector and 4 green detectors. Usually the area of the smaller detectors (green) together would approximately equal the area of the larger detector areas (red and blue). This would provide higher resolution in luminance while reducing the number of transistors for the chrominance.

This structure may be combined with the sequential readout circuit of the invention to create a particularly compact pixel. In this arrangement each detector of the pixel has a single color-enable transistor whose output couples to the photocharge-output-signal node of the pixel. Several smaller detectors on one color may be included in a single source-follower and row enable transistor pixel output structure with proportionally fewer detectors of another color. For example, if the red and blue sensors from a two by two array of sensor groups were shorted together, the four reds shorted to one another and the four blues shorted to one another, they could be combined with the four green sensors into a single output cell. This cell would have six color-enables, one for red, one for blue and four for green. It would output through a single source-follower and row-enable transistor, thus saving area in the sensor group that would otherwise be taken up with more source-follower and row-enable transistors.

Figure 20:
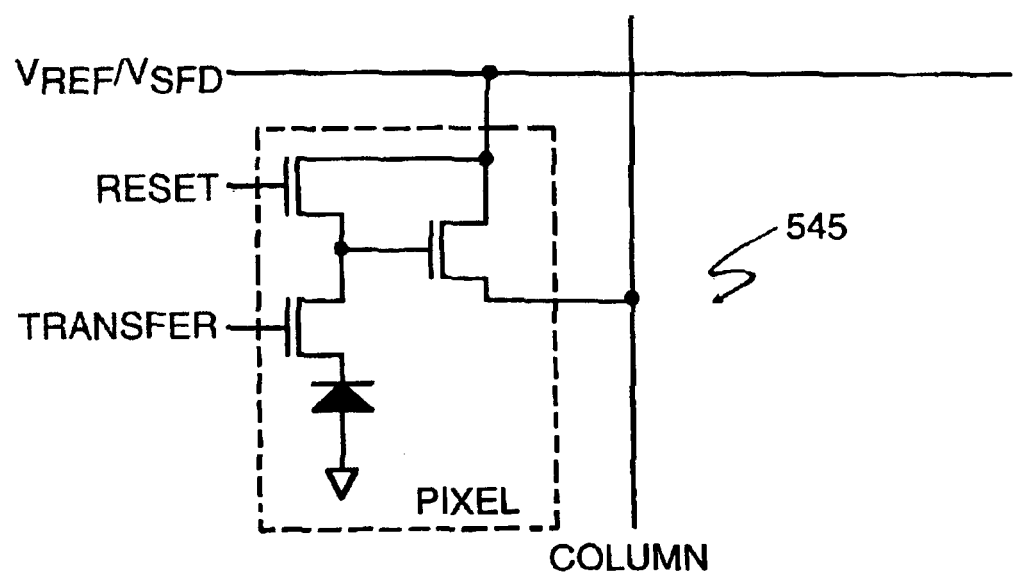
FIG. 20 is a schematic illustrating a pixel sensor having a shared line for source-follower voltage and reset voltage as shown in previous active pixel sensors.

It is possible to simplify pixel sensors in array 500 even more by removing the row-enable gate as described in U.S. Pat. No. 5,949,061 and illustrated in pixel sensor 545 in FIG. 20. Because there is no row-enable gate in the pixel sensor shown in FIG. 20, the operation must prevent the source-follower from turning on when other rows in the array are being read out due to the gate of the source-follower being at a voltage greater than the threshold voltage and $V_{ref}/V_{SFD}$ being at ground. The pixel sensor is reset by driving the $V_{ref}/V_{SFD}$ to the pixel reset voltage and driving high the reset and transfer signals. This will charge up the photodiode to a known voltage. The transfer gate and reset signal and $V_{ref}/V_{SFD}$ are driven low. After a set integration time the voltage on the photodiode will have decreased proportionally to the number of photons intercepted by the photodiode. To read out the pixel the gates on all of the source-follower amplifiers must be reset to zero, or slightly below zero, to prevent them from turning on while other rows are being read out. This is done by driving $V_{ref}/V_{SFD}$ low and reset high while the transfer signal is low. Once that is complete reset can be driven low and then row by row the $V_{ref}/V_{SFD}$ and transfer signal for a row can be driven high which will make the source-followers for that row operational and a voltage proportional to the photodiode voltage is driven onto the column-output lines. Before moving on to read the next row the source-follower gate must again be discharged. This is done by driving $V_{ref}/V_{SFD}$ to ground and asserting the reset signal for the row just read. Then reset can be de-asserted and the next row can be read. While the operation is slightly more complicated, it does eliminate another transistor from the pixel sensor.

Figure 21:
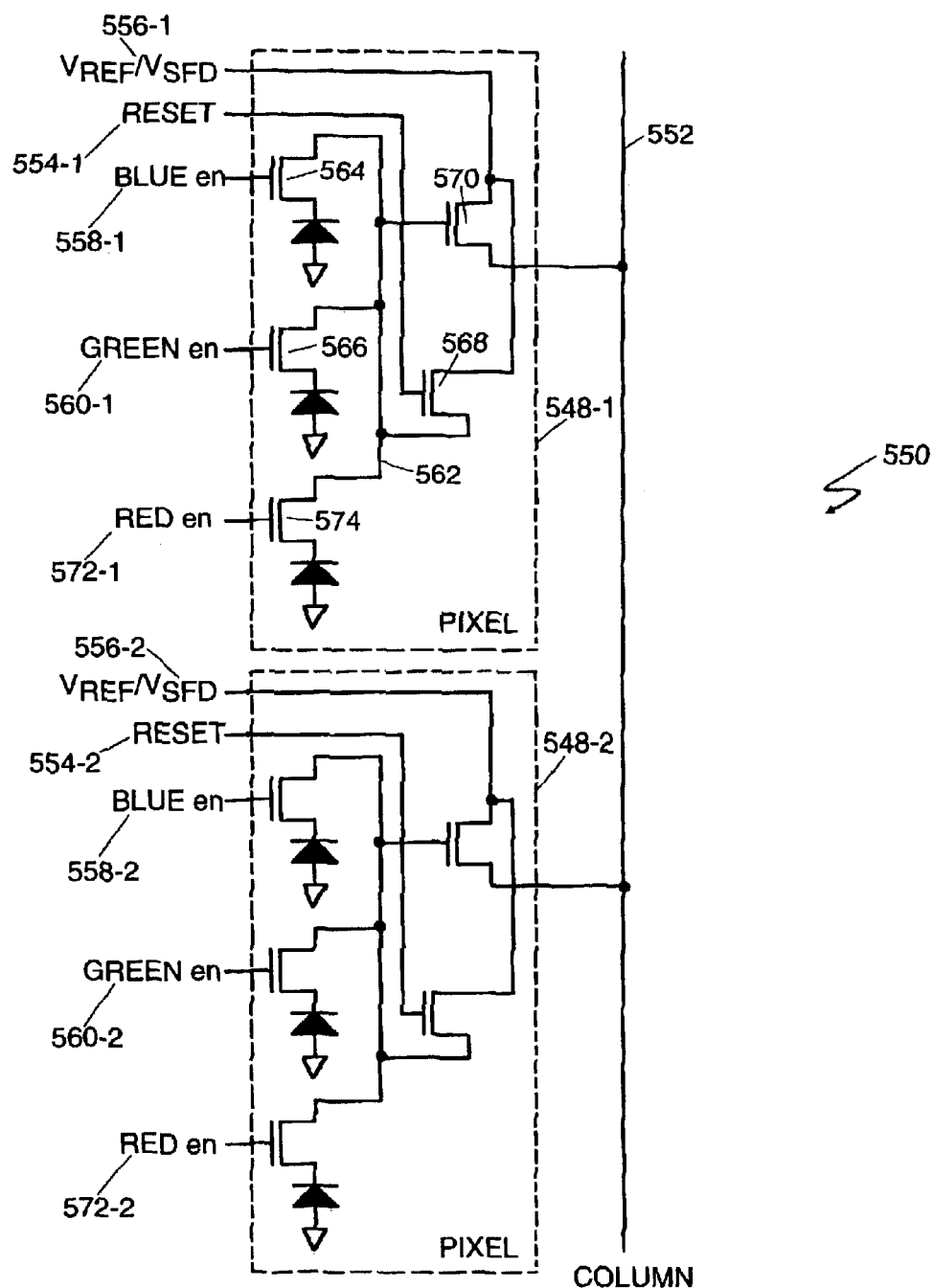
FIG. 21 is a schematic illustrating a VCF pixel sensor having one column-output line with a shared line for reset voltage and source-follower voltage.

It is also possible to remove the row-enable gate from a VCF pixel sensor shown in VCF pixel sensor 550 in FIG. 21. VCF pixel sensor 550 has only five transistors and six wires, with four of the wires (the three enable lines and the reset voltage $V_{ref}$ line) carrying low impedance signals. One advantage of this is that low impedance lines are less sensitive to some process defects than high impedance lines, improving yield.

Array 550 includes a plurality of rows and columns of active vertical-color-filter pixel sensors formed on a semiconductor substrate, an array column (n), and column-output line 552. The column has a plurality of rows. Each row includes reset-signal line 554, reference-voltage/source-follower-drain-voltage line 556, color-enable line 558, color-enable line 560, and a pixel sensor.

The pixel sensor includes first and second detector layers disposed substantially in vertical alignment with each other, having different spectral sensitivities as a function of their different depths in the semiconductor substrate, and are configured to collect photo-generated carriers of a first polarity. The first and second detector layers are separated by additional intervening layers configured to collect and conduct away photo-generated carriers of the opposite polarity. Also included is photocharge-output-signal node 562.

Color-enable transistor 564 is coupled between first detector layer and photocharge-output-signal node 562, and has a gate coupled to color-enable line 558. Color-enable transistor 566 is coupled between the second detector layer and photocharge-output-signal node 562, and has a gate coupled to color-enable line 560. Reset transistor 568 is coupled between photocharge-output-signal node 562 and reference-voltage/source-follower-drain-voltage line 556, and has a gate coupled to reset-signal line 554. Source-follower transistor 570 has a gate coupled to photocharge-output-signal node 562, a drain coupled to reference-voltage/source-follower-drain-voltage line 556, and a source coupled to column-output line 552.

Array 550 can also be implemented to accommodate three detector layers. In such an embodiment, column (n) further includes a third color-enable line 572. A third detector layer is configured to collect photo-generated carriers of a first polarity and is separated from the first and second detector layers by additional intervening layers configured to collect and conduct away photo-generated carriers of the opposite polarity. The third detector layer disposed substantially in vertical alignment with the first and second detector layers and has a spectral sensitivity as a function of its depth in the semiconductor substrate. Color-enable transistor 574 is coupled between the third detector and photocharge-output-signal node 562, and has a gate coupled to color-enable line 572.

To cancel the fixed pattern noise caused by threshold variation in the source follower amplifier, for example, one can perform additional reads to measure the fixed pattern noise and then subtract this noise from the pixel values that are read. This is done by reading the value on the column-output after the photocharge-output-signal node is reset, to the same level that the photodiode was reset to before the start of integration, but before one of the color enables are reset. Then, one of the color enables are asserted and the pixel values are read. By subtracting the pixel value that was read from the photocharge-output-signal node reset value that was read, the fixed pattern noise will be cancelled.

It is also possible to build an APS sensor where some of the detector layers are larger (area in the horizontal plane) then the other detector layers, disclosed in U.S. patent application Ser. No. 10/103,304 to Merrill et al. and to [Reference Fov-122]. This would be done to make a pixel structure that has a much better fill factor. For example, a pixel could contain one red and one blue detector and 4 green detectors. Usually the area of the smaller detectors (green) together would approximately equal the area of the larger detector areas (red and blue). This would provide higher resolution in luminance while reducing the number of transistors for the chrominance.

This structure may be combined with the sequential readout circuit of the invention to create a particularly compact pixel. In this arrangement each detector of the pixel has a single color-enable transistor whose output couples to the photocharge-output-signal node of the pixel. Several smaller detectors on one color may be included in a single source-follower and row enable transistor pixel output structure with proportionally fewer detectors of another color. For example, if the red and blue sensors from a two by two array of sensor groups were shorted together, the four reds shorted to one another and the four blues shorted to one another, they could be combined with the four green sensors into a single output cell. This cell would have six color-enables, one for red, one for blue and four for green. It would output through a single source-follower and row-enable transistor, thus saving area in the sensor group that would otherwise be taken up with more source-follower and row-enable transistors.

Figure 22:
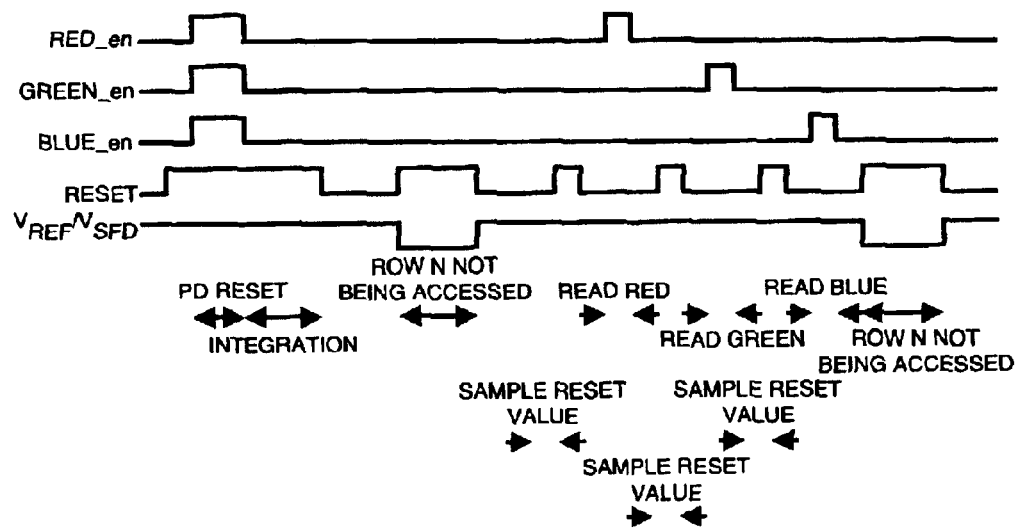
FIG. 22 is a schematic illustrating the timing for the operation of a simplified VCF pixel sensor.

FIG. 22 illustrates the timing operation of VCF pixel sensor 550. To operate pixel sensor 550 it is first necessary to charge up the photodiode to a known voltage. This is done by driving reset voltage $V_{ref}$, onto the $V_{ref}/V_{SFD}$ lines 556. Then the reset signal is asserted followed by the color-enable signals. Resetting the three photodiodes in pixel sensor 550 can be accomplished by sequencing through the different color-enables and changing the voltage $V_{ref}$ driven onto the $V_{ref}/V_{SFD}$ lines 556 for each of the photodiodes in pixel sensor 550. During integration it is possible to leave the $V_{ref}/V_{SFD}$ lines 556 at $V_{ref}$ and the reset signal asserted with the color-enable lines disabled. This provides an anti-blooming overflow path. After a set integration time, the voltage on each of the photodiodes will have decreased proportionally to the number of photons intercepted by each photodiode. Before reading any rows out it is necessary to discharge the gate on the source-follower by driving the $V_{ref}/V_{SFD}$ line 556 to ground and asserting the reset signal. This discharges the gate on the source-follower amplifier to make sure it is turned off when other rows in array 550 are being read. To read a row, the $V_{ref}/V_{SFD}$ line 556 is asserted while the reset voltage $V_{ref}$ line is still asserted which will charge up the gate of the source-follower amplifier. Then the reset signal for the row being read is deasserted and one of the color-enable lines is asserted. Then a signal proportional to the voltage at the photodiode that is selected is driven onto column-output line 552. The color-enable signal is deasserted and the reset signal is again asserted to set the voltage on the source-follower to a known value. Then reset is deasserted and the next color-enable is asserted. The source-follower gate is reset to a known voltage and the last photodiode can be read. The gate of the source-follower should then be reset to ground as before so that other rows can be read.

While embodiments and application of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A passive vertical-color-filter pixel sensor formed on a semiconductor substrate and comprising:
   n detector layers configured to collect photo-generated carriers of a first polarity, separated by additional intervening layers configured to collect and conduct away photo-generated carriers of the opposite polarity, the n layers disposed substantially in vertical alignment with each other and having different spectral sensitivities as a function of their different depths in the semiconductor substrate;

a column-output line;

n color-enable lines, a different one of said color-enable lines associated with each of said detector layers;

n color-enable transistors, each color-enable transistor coupled between a different one of said detector layers and said column output line, each color-enable transistor having a gate coupled to a different one of said n color-enable lines; and wherein $n \geq 2$.

2. The passive vertical-color-filter pixel sensor of claim 1 where n=3.

3. An active vertical-color-filter pixel sensor formed on a semiconductor substrate and comprising:

a plurality of detector layers configured to collect photo-generated carriers of a first polarity, each of said plurality of detector layers separated by additional intervening layers configured to collect and conduct away photo-generated carriers of the opposite polarity, each of said plurality of detector layers disposed substantially in vertical alignment with each other and having different spectral sensitivities as a function of their different depths in the semiconductor substrate;

a reset-signal line;

a row-enable line;

a source-follower-drain-voltage line;

a plurality of column-output/reference-voltage lines;

a plurality of reset transistors, each coupled between one of said plurality of detector layers and one of said plurality of column-output/reference-voltage lines, each of said plurality of reset transistors having a gate coupled to said reset-signal line;

a plurality of source-follower transistors, each having a gate coupled to one of said plurality of detector layers, a drain coupled to said source-follower-drain-voltage line, and a source; and a plurality of output-enable transistors, each having a gate coupled to said row-enable line, a drain coupled to said source of one of said plurality of source-follower transistors, and a source coupled to one of said plurality of column-output/reference-voltage lines.

4. An active vertical-color-filter pixel sensor formed on a semiconductor substrate and associated with a row (m) and a column (n) of an array having a plurality of rows and columns of such active pixel sensors and comprising:

a plurality of detector layers configured to collect photo-generated carriers of a first polarity, said first plurality and second plurality of detector layers separated by additional intervening layers configured to collect and conduct away photo-generated carriers of the opposite polarity, said plurality of detector layers disposed substantially in vertical alignment with each other and having different spectral sensitivities as a function of their different depths in the semiconductor substrate;

a reset-signal/row-enable line associated with the row (m) of said array;

a reset-signal/row-enable line associated with a row (m+1) of said array;

a source-follower-drain-voltage line;

a plurality of column-output/reference-voltage lines, each associated with column (n) of said array;

a plurality of reset transistors, each coupled between one of said plurality of detector layers and one of said plurality of column-output/reference-voltage lines, said plurality of reset transistors each having a gate coupled to said reset-signal/row-enable line associated with said row (m+1) of said array;

a plurality of source-follower transistors, each having a gate coupled to one of said plurality of detector layers, a drain coupled to said source-follower-drain-voltage line, and a source; and a plurality of output-enable transistors, each having a gate coupled to said reset-signal/row-enable line associated with said row (m) of said array, a drain coupled to said source of one of said plurality of source-follower transistors, and a source coupled to one of said plurality of column-output/reference-voltage lines.

5. In an array including a plurality of rows and columns of active vertical-color-filter pixel sensors formed on a semiconductor substrate, an array column (n), including a plurality of column-output/reference-voltage lines, the column (n) comprising a plurality of rows, each row comprising:

a reset-signal/row-enable line;

a source-follower-drain-voltage line;

a plurality of pixel sensors, each pixel sensor including:

a plurality of detector layers disposed substantially in vertical alignment with each other, having different spectral sensitivities as a function of their different depths in the semiconductor substrate, and configured to collect photo-generated carriers of a first polarity, the plurality of detector layers separated by additional intervening layers configured to collect and conduct away photo-generated carriers of the opposite polarity;

a plurality of reset transistors, each coupled between one of said plurality of detector layers and one of said plurality of column-output/reference-voltage lines, said plurality of reset transistors each having a gate coupled to said reset-signal/row-enable line;

a plurality of source-follower transistors, each having a gate, a drain coupled to said source-follower-drain-voltage line, and a source;

a plurality of output-enable transistors, each having a gate coupled to said reset-signal/row-enable line, a drain coupled to said source of each of said plurality of source-follower transistors, and a source coupled to each of said plurality of column-output/reference-voltage lines; and wherein said gate of each of said plurality of source-follower transistors in each pixel sensor in each row (m) in the column (n) other than in a last row in said array is coupled to one of the plurality of detector layers of the pixel sensor in row (m+1) in said column (n).

6. In an array including a plurality of rows and columns of active vertical-color-filter pixel sensors formed on a semiconductor substrate, an array column (n), including a plurality of column-output/reference-voltage lines, the column (n) comprising a plurality of rows, each row comprising:

a reset-signal/row-enable line;

a source-follower-drain-voltage/reference-voltage line;

a plurality of pixel sensors each including:

a plurality of detector layers disposed substantially in vertical alignment with each other, having different spectral sensitivities as a function of their different depths in the semiconductor substrate, and configured to collect photo-generated carriers of a first polarity, the plurality of detector layers separated by additional intervening layers configured to collect and conduct away photo-generated carriers of the opposite polarity;

a plurality of reset transistors, each coupled between one of said plurality of detector layers and said source-follower-drain-voltage/reference-voltage line, said plurality of reset transistors having a gate;

a plurality of source-follower transistors, each having a gate coupled to one of said plurality of detector layers, a drain coupled to said source-follower-drain-voltage/reference-voltage line, and a source;

a plurality of output-enable transistors, each having a gate coupled to said reset-signal/row-enable line, a drain coupled to said source of one of said plurality of source-follower transistors, and a source coupled to said column-output/reference-voltage line; and wherein said gates of said plurality of reset transistors in each pixel sensor in each row (m) in the column (n) other than in a last row in said array are coupled to the reset-signal/row-enable line of the pixel sensor in row (m+1) in said column (n).

7. An active vertical-color-filter pixel sensor formed on a semiconductor substrate comprising:

a plurality of detector layers configured to collect photo-generated carriers of a first polarity, said first and second detector layers separated by additional intervening layers configured to collect and conduct away photo-generated carriers of the opposite polarity, said plurality of detector layers disposed substantially in vertical alignment with each other and having different spectral sensitivities as a function of their different depths in the semiconductor substrate;

a reset-signal line;

a source-follower-drain-voltage/reference-voltage/row-enable line;

a plurality of column-output lines;

a plurality of reset transistors, each coupled between one of said plurality of detector layers and said source-follower-drain-voltage/reference-voltage/row-enable line, said plurality of reset transistors each having a gate coupled to said reset-signal line;

a plurality of source-follower transistors, each having a gate coupled to one of said plurality of detector layers, a drain coupled to said source-follower-drain-voltage/reference-voltage/row-enable line, and a source; and a plurality of output-enable transistors, each having a gate coupled to said source-follower-drain-voltage/reference-voltage/row-enable line, a drain coupled to said source of one of said plurality of source-follower transistors, and a source coupled to one of said plurality of column-output lines.

8. In an array including a plurality of rows and columns of active vertical-color-filter pixel sensors formed on a semiconductor substrate, an array column (n), including a plurality of column-output/reference-voltage lines, the column (n) comprising a plurality of rows, each row comprising:

a reset-signal/row-enable/source-follower-drain-voltage line;

a plurality of pixel sensors, each pixel sensor including:

a plurality of detector layers disposed substantially in vertical alignment with each other, having different spectral sensitivities as a function of their different depths in the semiconductor substrate, and configured to collect photo-generated carriers of a first polarity, the plurality of detector layers separated by additional intervening layers configured to collect and conduct away photo-generated carriers of the opposite polarity;

a plurality of reset transistors, each coupled between one of said plurality of detector layers and said column-output/reference-voltage line, said plurality of reset transistors each having a gate;

a plurality of source-follower transistors, each having a gate coupled to one of said plurality of detector layers, a drain coupled to said reset-signal/row-enable/source-follower-drain-voltage line, and a source;

a plurality of output-enable transistors, each having a gate coupled to said reset-signal/row-enable/source-follower-drain-voltage line, a drain coupled to said source of one of said plurality of source-follower transistors, and a source coupled to one of said plurality of column-output/reference-voltage lines; and wherein each of said gates of said plurality of reset transistors in each pixel sensor in each row (m) in the column (n) other than in a last row in said array are coupled to the reset-signal/row-enable/source-follower-drain-voltage line of the pixel sensor in row (m+1) in said column (n).

9. In an array including a plurality of rows and columns of active vertical-color-filter pixel sensors formed on a semiconductor substrate, an array column (n), including a column-output/reference-voltage line, the column (n) comprising a plurality of rows, each row comprising:

a reset-signal/row-enable/source-follower-drain-voltage line;

a plurality of color-enable lines;

a plurality of pixel sensors, each pixel sensor including:

a plurality of detector layers disposed substantially in vertical alignment with each other, having different spectral sensitivities as a function of their different depths in the semiconductor substrate, and configured to collect photo-generated carriers of a first polarity, the plurality of detector layers separated by additional intervening layers configured to collect and conduct away photo-generated carriers of the opposite polarity;

a photocharge-output-signal node;

a plurality of color-enable transistors, each coupled between one of said plurality of detector layers and said photocharge-output-signal node, said plurality of color-enable transistors each having a gate coupled to one of said plurality of color-enable lines;

a reset transistor coupled between said photocharge-output-signal node and said column-output/reference-voltage line, said reset transistor having a gate;

a source-follower transistor having a gate coupled to said photocharge-output-signal node, a drain coupled to said reset-signal/row-enable/source-follower-drain-voltage line, and a source;

an output-enable transistor having a gate coupled to said reset-signal/row-enable/source-follower-drain-voltage line, a drain coupled to said source of said source-follower transistor, and a source coupled to said column-output/reference-voltage line; and wherein said gate of said reset transistor in each pixel sensor in each row (m) in the column (n) other than in a last row in said array is coupled to the reset-signal/row-enable/source-follower-drain-voltage line of the pixel sensor in row (m+1) in said column (n).

10. In an array including a plurality of rows and columns of active vertical-color-filter pixel sensors formed on a semiconductor substrate, an array column (n), including a column-output line, the column (n) comprising a plurality of rows, each row comprising:
- a reset-signal line;
- a reference-voltage/source-follower-drain-voltage line;
- a plurality of color-enable lines;
- a plurality of pixel sensors, each pixel sensor including:
  - a plurality of detector layers disposed substantially in vertical alignment with each other, having different spectral sensitivities as a function of their different depths in the semiconductor substrate, and configured to collect photo-generated carriers of a first polarity, the plurality of detector layers separated by additional intervening layers configured to collect and conduct away photo-generated carriers of the opposite polarity;
  - a photocharge-output-signal node;
  - a plurality of color-enable transistors, each coupled between one of said plurality of detector layers and said photocharge-output-signal node, said plurality of color-enable transistors each having a gate coupled to one of said plurality of color-enable lines;
  - a reset transistor coupled between said photocharge-output-signal node and said reference-voltage/source-follower-drain-voltage line, said reset transistor having a gate coupled to said reset-signal line; and
  - a source-follower transistor having a gate coupled to said photocharge-output-signal node, a drain coupled to said reference-voltage/source-follower-drain-voltage line, and a source coupled to the column-output line.

11. An active vertical-color-filter pixel sensor formed on a semiconductor substrate and comprising:
- a reset-signal line;
- a row-enable line;
- a source-follower-drain-voltage line;
- a plurality of detector layers configured to collect photo-generated carriers of a first polarity, each detector layer separated from one another by additional intervening layers configured to collect and conduct away photo-generated carriers of the opposite polarity, each detector layer disposed substantially in vertical alignment with each other and having different spectral sensitivities as a function of their different depths in the semiconductor substrate, each detector layer comprising;
- a column-output/reference-voltage line;
- a reset transistor coupled between said detector layer and said column-output/reference-voltage line, said reset transistor having a gate coupled to said reset-signal line;
- a source-follower transistor having a gate coupled to said detector layer, a drain coupled to said source-follower-drain-voltage line, and a source; and
- an output-enable transistor having a gate coupled to said row-enable line, a drain coupled to said source of said source-follower transistor, and a source coupled to said column-output/reference-voltage line.

12. An active vertical-color-filter pixel sensor formed on a semiconductor substrate and associated with a row (m) and a column (n) of an array having a plurality of rows and columns of such active pixel sensors and comprising:
- a reset-signal/row-enable line associated with the row (m) of said array;
- a reset-signal/row-enable line associated with a row (m+1) of said array;
- a source-follower-drain-voltage line;
- a plurality of detector layers configured to collect photo-generated carriers of a first polarity, each detector layer separated from one another by additional intervening layers configured to collect and conduct away photo-generated carriers of the opposite polarity, each detector layer disposed substantially in vertical alignment with each other and having different spectral sensitivities as a function of their different depths in the semiconductor substrate, each detector layer comprising:
  - a column-output/reference-voltage line associated with column (n) of said array;
  - a reset transistor coupled between said detector layer and said column-output/reference-voltage line, said reset transistor having a gate coupled to said reset-signal/row-enable line associated with said row (m+1) of said array;
  - a source-follower transistor having a gate coupled to said detector layer, a drain coupled to said source-follower-drain-voltage line, and a source; and
- an output-enable transistor having a gate coupled to said reset-signal/row-enable line associated with said row (m) of said array, a drain coupled to said source of said source-follower transistor, and a source coupled to said column-output/reference-voltage line.

13. In an array including a plurality of rows and columns of active vertical-color-filter pixel sensors formed on a semiconductor substrate, an array column (n) including a plurality of column-output/reference-voltage lines, the column (n) comprising a plurality of rows, each row comprising:
- a reset-signal/row-enable line;
- a source-follower-drain-voltage line;
- a plurality of pixel sensors, each pixel sensor including:
  - a plurality of detector layers disposed substantially in vertical alignment with each other, having different spectral sensitivities as a function of their different depths in the semiconductor substrate, and configured to collect photo-generated carriers of a first polarity, each detector layer separated from one another by additional intervening layers configured to collect and conduct away photo-generated carriers of the opposite polarity, each detector layer comprising:
    - a reset transistor coupled between said detector layer and one of said column-output/reference-voltage lines, said reset transistor having a gate coupled to said reset-signal/row-enable line;
    - a source-follower transistor having a gate, a drain coupled to said source-follower-drain-voltage line, and a source;
    - an output-enable transistor having a gate coupled to said reset-signal/row-enable line, a drain coupled to said source of said source-follower transistor, and a source coupled to one of said column-output/reference-voltage lines; and
  - wherein said gate of said source-follower transistor in each pixel sensor in each row (m) in the column (n) other than in a last row in said array is coupled to said detector layer of the pixel sensor in row (m+1) in said column (n).

14. In an array including a plurality of rows and columns of active vertical-color-filter pixel sensors formed on a semiconductor substrate, an array column (n), including a plurality of column-output/reference-voltage lines, the column (n) comprising a plurality of rows, each row comprising:

a reset-signal/row-enable line;

a source-follower-drain-voltage/reference-voltage line;

a plurality of pixel sensors each including:

a plurality of detector layers disposed substantially in vertical alignment with each other, having different spectral sensitivities as a function of their different depths in the semiconductor substrate, and configured to collect photo-generated carriers of a first polarity, each detector layer separated by additional intervening layers configured to collect and conduct away photo-generated carriers of the opposite polarity, each detector layer comprising:

a reset transistor coupled between said detector layer and said source-follower-drain-voltage/reference-voltage line, said reset transistor having a gate coupled to said reset-signal/row-enable line;

a source-follower transistor having a gate coupled to said detector layer, a drain coupled to said source-follower-drain-voltage/reference-voltage line, and a source;

an output-enable transistor having a gate coupled to said reset-signal/row-enable line, a drain coupled to said source of said source-follower transistor, and a source coupled to one of said column-output/reference-voltage lines; and wherein said gate of said reset transistor in each pixel sensor in each row (m) in the column (n) other than in a last row in said array are coupled to the reset-signal/row-enable line of the pixel sensor in row (m+1) in said column (n).

15. An active vertical-color-filter pixel sensor formed on a semiconductor substrate comprising:

a reset-signal line;

a source-follower-drain-voltage/reference-voltage/row-enable line;

a plurality of detector layers configured to collect photo-generated carriers of a first polarity, each detector layer separated from one another by additional intervening layers configured to collect and conduct away photo-generated carriers of the opposite polarity, each detector layers disposed substantially in vertical alignment with each other and having different spectral sensitivities as a function of their different depths in the semiconductor substrate, each detector layer comprising:

a column-output line;

a reset transistor coupled between said detector layer and said source-follower-drain-voltage/reference-voltage/row-enable line, said reset transistor having a gate coupled to said reset-signal line;

a source-follower transistor having a gate coupled to said detector layer, a drain coupled to said source-follower-drain-voltage/reference-voltage/row-enable line, and a source; and an output-enable transistor having a gate coupled to said source-follower-drain-voltage/reference-voltage/row-enable line, a drain coupled to said source of said source-follower transistor, and a source coupled to said first column-output line.

16. In an array including a plurality of rows and columns of active vertical-color-filter pixel sensors formed on a semiconductor substrate, an array column (n), including a column-output/reference-voltage line, the column (n) comprising a plurality of rows, each row comprising:

a reset-signal/row-enable/source-follower-drain-voltage line;

a plurality of pixel sensors, each pixel sensor including:

a plurality of detector layers disposed substantially in vertical alignment with each other, having different spectral sensitivities as a function of their different depths in the semiconductor substrate, and configured to collect photo-generated carriers of a first polarity, each detector layers separated from one another by additional intervening layers configured to collect and conduct away photo-generated carriers of the opposite polarity, each detector layer comprising:

a reset transistor coupled between said detector layer and said column-output/reference-voltage line, said reset transistor having a gate;

a source-follower transistor having a gate coupled to said detector layer, a drain coupled to said reset-signal/row-enable/source-follower-drain-voltage line, and a source;

an output-enable transistor having a gate coupled to said reset-signal/row-enable/source-follower-drain-voltage line, a drain coupled to said source of said first source-follower transistor, and a source coupled to said first column-output/reference-voltage line; and wherein said gates of said reset transistors in each pixel sensor in each row (m) in the column (n) other than in a last row in said array are coupled to the reset-signal/row-enable/source-follower-drain-voltage line of the pixel sensor in row (m+1) in said column (n).

17. In an array including a plurality of rows and columns of active vertical-color-filter pixel sensors formed on a semiconductor substrate, an array column (n), including a column-output/reference-voltage line, the column (n) comprising a plurality of rows, each row comprising:

a reset-signal/row-enable/source-follower-drain-voltage line;

a plurality of pixel sensors, each pixel sensor including:

a photocharge-output-signal node;

a reset transistor coupled between said photocharge-output-signal node and said column-output/reference-voltage line, said reset transistor having a gate, wherein said gate of said reset transistor in each pixel sensor in each row (m) in the column (n) other than in a last row in said array is coupled to the reset-signal/row-enable/source-follower-drain-voltage line of the pixel sensor in row (m+1) in said column (n);

a source-follower transistor having a gate coupled to said photocharge-output-signal node, a drain coupled to said reset-signal/row-enable/source-follower-drain-voltage line, and a source;

an output-enable transistor having a gate coupled to said reset-signal/row-enable/source-follower-drain-voltage line, a drain coupled to said source of said source-follower transistor, and a source coupled to said column-output/reference-voltage line;

a plurality of detector layers disposed substantially in vertical alignment with each other, having different spectral sensitivities as a function of their different depths in the semiconductor substrate, and configured to collect photo-generated carriers of a first polarity, each detector layer separated from one another by additional intervening layers configured to collect and conduct away photo-generated carriers of the opposite polarity, each detector layer comprising:
  a color-enable line; and
  a color-enable transistor coupled between said detector layer and said photocharge-output-signal node, said color-enable transistor having a gate coupled to said color-enable line.

18. In an array including a plurality of rows and columns of active vertical-color-filter pixel sensors formed on a semiconductor substrate, an array column (n), including a column-output line, the column (n) comprising a plurality of rows, each row comprising:
  a reset-signal line;
  a reference-voltage/source-follower-drain-voltage line;
  a plurality of pixel sensors, each pixel sensor including:
  a photocharge-output-signal node;
  a reset transistor coupled between said photocharge-output-signal node and said reference-voltage/source-follower-drain-voltage line, said reset transistor having a gate coupled to said reset-signal line; and
  a source-follower transistor having a gate coupled to said photocharge-output-signal node, a drain coupled to said reference-voltage/source-follower-drain-voltage line, and a source coupled to the column-output line
  a plurality of detector layers disposed substantially in vertical alignment with each other, having different spectral sensitivities as a function of their different depths in the semiconductor substrate, and configured to collect photo-generated carriers of a first polarity, each detector layer separated from one another by additional intervening layers configured to collect and conduct away photo-generated carriers of the opposite polarity, each detector layer comprising:
  a color-enable line; and
  a color-enable transistor coupled between said detector layer and said photocharge-output-signal node, said color-enable transistor having a gate coupled to said color-enable line.

19. An active vertical-color-filter pixel sensor formed on a semiconductor substrate and comprising:
  a plurality of detector layers configured to collect photo-generated carriers of a first polarity, each of said plurality of detector layers separated by additional intervening layers configured to collect and conduct away photo-generated carriers of the opposite polarity, each of said plurality of detector layers disposed substantially in vertical alignment with each other and having different spectral sensitivities as a function of their different depths in the semiconductor substrate;
  a reset-signal line;
  a row-enable line;
  a source-follower-drain-voltage line;
  a plurality of column-output/reference-voltage lines;
  a plurality of reset transistors, each coupled between one of said plurality of detector layers and one of said plurality of column-output/reference-voltage lines, each of said plurality of reset transistors having a gate coupled to said reset-signal line;
  a plurality of source-follower transistors, each having a gate coupled to one of said plurality of detector layers, a drain coupled to said source-follower-drain-voltage line, and a source; and
  a plurality of output-enable transistors, each having a gate coupled to said row-enable line, a drain coupled to said source of one of said plurality of source-follower transistors, and a source coupled to one of said plurality of column-output/reference-voltage lines.

* * * * *